(12) United States Patent
Broyde et al.

(10) Patent No.: US 9,966,924 B2
(45) Date of Patent: May 8, 2018

(54) METHOD OF AUTOMATIC ADJUSTMENT OF A TUNABLE IMPEDANCE MATCHING CIRCUIT, AND AUTOMATIC TUNING SYSTEM USING THIS METHOD

(71) Applicant: TEKCEM, Maule (FR)

(72) Inventors: Frédéric Broyde, Maule (FR); Evelyne Clavelier, Maule (FR)

(73) Assignee: TEKCEM (FR)

( * ) Notice: Subject to any disclaimer, the term of this patent is extended or adjusted under 35 U.S.C. 154(b) by 0 days. days.

(21) Appl. No.: 15/795,822

(22) Filed: Oct. 27, 2017

(65) Prior Publication Data

US 2018/0048279 A1 Feb. 15, 2018

Related U.S. Application Data

(63) Continuation of application No. PCT/IB2017/053267, filed on Jun. 2, 2017.

(30) Foreign Application Priority Data

Jun. 30, 2016 (FR) ...................................... 16 70357

(51) Int. Cl.
*H03H 7/38* (2006.01)
*H03H 7/40* (2006.01)
(52) U.S. Cl.
CPC ..................... *H03H 7/40* (2013.01)
(58) Field of Classification Search
CPC ........................................................ H03H 7/40
USPC ................... 333/17.3, 32; 327/551
See application file for complete search history.

(56) References Cited

U.S. PATENT DOCUMENTS

| | | | |
|---|---|---|---|
| 2,523,791 | A | 9/1950 | Vahle et al. |
| 2,745,067 | A | 5/1956 | True et al. |
| 3,443,231 | A | 5/1969 | Roza |
| 4,356,458 | A | 10/1982 | Armitage |
| 4,493,112 | A | 1/1985 | Bruene |
| 5,225,847 | A | 7/1993 | Roberts et al. |
| 5,564,086 | A | 10/1996 | Cygan et al. |

(Continued)

OTHER PUBLICATIONS

Ariyur et al., "Real-Time Optimization by Extremum-Seeking Control", Wiley-Interscience, 2003.

(Continued)

*Primary Examiner* — Thomas Skibinski
(74) *Attorney, Agent, or Firm* — Barnes & Thornburg LLP

(57) ABSTRACT

The invention relates to a method of automatic adjustment of a single-input-port and single-output-port tunable matching circuit, for instance a single-input-port and single-output-port tunable matching circuit coupled to an antenna of a radio transceiver. The invention also relates to an automatic tuning system using this method. The reactance of each adjustable impedance device of the tunable matching circuit is determined by at least one tuning control signal. In addition to the begin symbol and the end symbol, a flowchart of a tuning sequence comprises: a process generating initial values of the tuning control signals, which uses an open-loop control scheme using one or more real quantities depending on an impedance seen by the target port; and a process generating subsequent values of the tuning control signals, which uses a closed-loop control scheme and an extremum-seeking control algorithm.

20 Claims, 10 Drawing Sheets

(56) References Cited

U.S. PATENT DOCUMENTS

| | | | |
|---|---|---|---|
| 6,414,562 B1 | 7/2002 | Bouisse et al. | |
| 7,535,312 B2 | 5/2009 | McKinzie, III | |
| 7,714,676 B2 | 5/2010 | McKinzie, III | |
| 8,190,109 B2 | 5/2012 | Ali et al. | |
| 8,299,867 B2 | 10/2012 | McKinzie, III | |
| 2003/0174100 A1* | 9/2003 | Ogawa | H01Q 1/242 343/895 |
| 2010/0073103 A1* | 3/2010 | Spears | H03H 7/40 333/17.3 |
| 2010/0182216 A1* | 7/2010 | Schmidhammer | H03H 7/40 343/861 |
| 2018/0041184 A1* | 2/2018 | Broyde | H03H 7/40 |

OTHER PUBLICATIONS

Liu et al., "Stochastic Averaging and Stochastic Extremum Seeking", Springer-Verlag, 2012.

Calli et al., "Comparison of Extremum Seeking Control Algorithms for Robotic Applications", Proc. of the 2012 IEEE/RSJ International Conference on Intelligent Robots and Systems, pp. 3195-3202, Oct. 2012.

Olalla et al., "Analysis and Comparison of Extremum Seeking Control Techniques", Proc. 2007 IEEE International Symposium on Industrial Electronics, pp. 72-76, Jun. 2007.

Zhang et al., "Extremum-Seeking Control and Application", Springer-Verlag, 2012.

Brent, "Algorithms for minimization without derivatives", Prentice-Hall, 1973.

Press et al., "Numerical Recipes in Fortran 77—The art of Scientific Computing", Second Edition, Cambridge University Press, 1992.

Broyde et al., "Some Properties of Multiple-Antenna-Port and Multiple-User-Port Antenna Tuners", IEEE Trans. on circuits and Systems—I: Regular Papers, vol. 62, No. 2, pp. 423-432, Feb. 2015.

Broyde et al., "A Tuning Computation Technique for a Multiple-Antenna-Port and Multiple-User-Port Antenna Tuner", International Journal of Antennas and Propagation, 2016.

Duong et al., "A dynamically adaptable impedance-matching system for midrange wireless power transfer with misalignment", Energies, 2015.

"IEC Multilingual Dictionary of Electricity", Bureau Central de la Commission Electrotechnique Internationale, 1983.

Smith et al., "An improved Topology for Adaptive Agile Impedance Tuners", IEEE Antennas and Wireless Propagation Letters, vol. 12, pp. 92-95, 2013.

ALi et al., "Dynamic Real-Time Calibration for Antenna Matching in the Transmission Mode", 2010 IEEE Antenna and Propagation Society International Symposium (APS/URSI), Jul. 2010.

\* cited by examiner

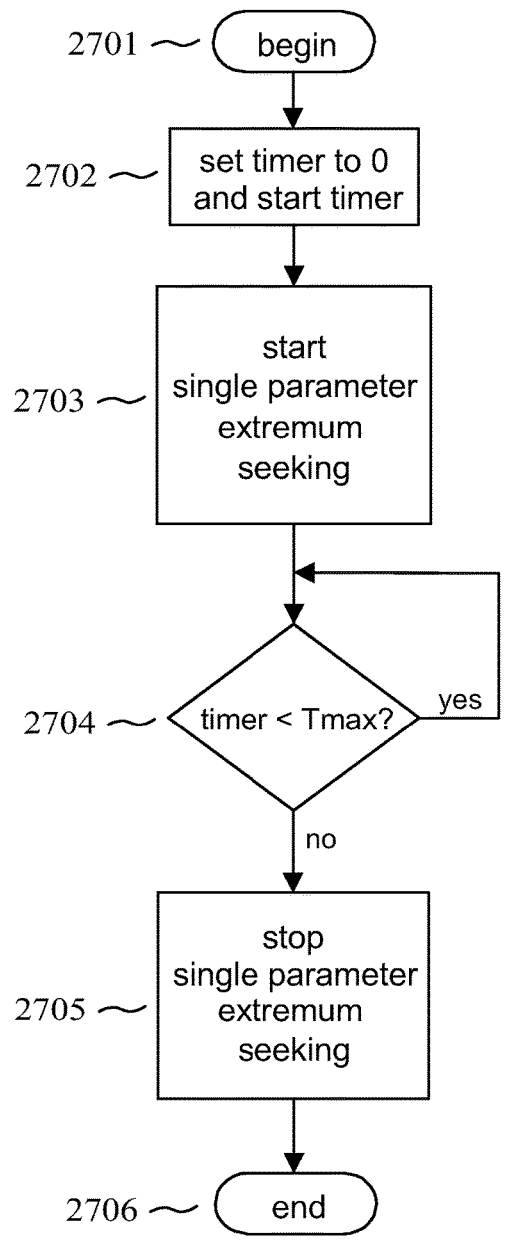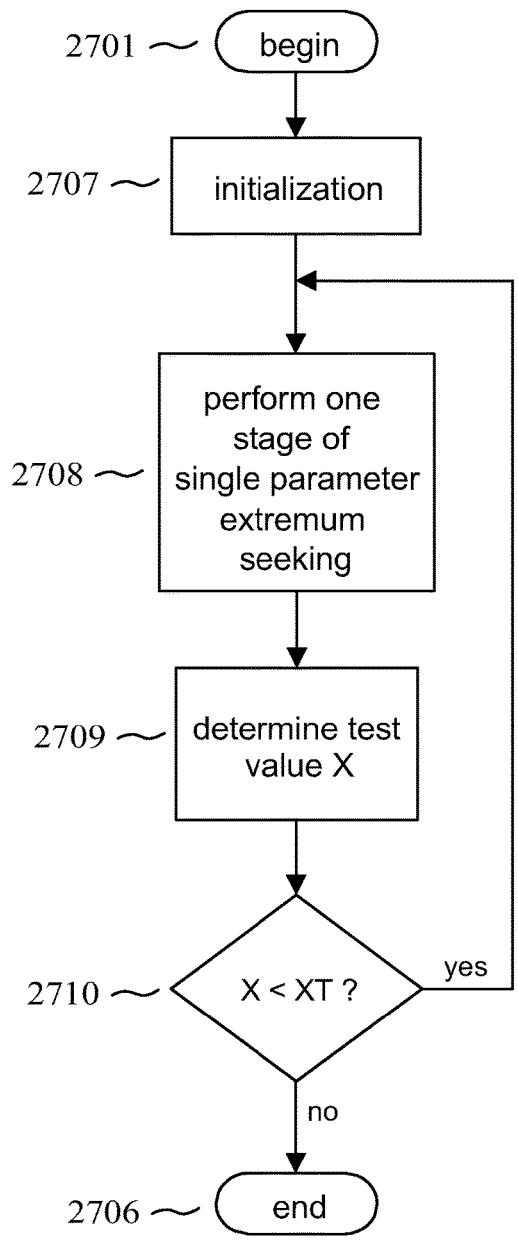
FIG. 6  FIG. 7

METHOD OF AUTOMATIC ADJUSTMENT OF A TUNABLE IMPEDANCE MATCHING CIRCUIT, AND AUTOMATIC TUNING SYSTEM USING THIS METHOD

CROSS-REFERENCE TO RELATED APPLICATION

This is a Continuation Application of PCT application No. PCT/IB2017/053267, filed 2 Jun. 2017, entitled "Method of automatic adjustment of a tunable impedance matching circuit, and automatic tuning system using this method", which in turn claims priority to French patent application No. FR1670357 of 30 Jun. 2016, entitled "Procédé réglage automatique d'un circuit d'adaptation accordable, et système d'accord automatique utilisant ce procédé", both of which are incorporated herein by reference.

FIELD OF THE INVENTION

The invention relates to a method of automatic adjustment of a single-input-port and single-output-port tunable matching circuit, for instance a single-input-port and single-output-port tunable matching circuit coupled to an antenna of a radio transceiver. The invention also relates to an automatic tuning system using this method.

PRIOR ART

In what follows, in line with the "IEC multilingual dictionary of electricity" edited by the *Bureau Central de la Commission Electrotechnique Internationale* in 1983, "open-loop control" means control which does not utilize a measurement of the controlled variable, and "closed-loop control" (which is also referred to as "feedback control") means control in which the control action is made to depend on a measurement of the controlled variable.

Tuning an impedance means obtaining that an impedance presented by an input port of a device approximates a wanted impedance, and simultaneously offering an ideally lossless, or nearly lossless, transfer of power from the input port to an output port of the device, in a context where the impedance seen by the output port may vary. Thus, if a signal generator presenting an impedance equal to the complex conjugate of the wanted impedance is connected to the input port, it will deliver a maximum power to the input port, this maximum power being referred to as "available power", and the output port will deliver a power near this maximum power.

A single-input-port and single-output-port tunable matching circuit behaves, at any frequency in a given frequency band, with respect to its input port and output port, substantially as a passive linear 2-port device. Here, "passive" is used in the meaning of circuit theory, so that the single-input-port and single-output-port tunable matching circuit does not provide amplification. A single-input-port and single-output-port tunable matching circuit comprises one or more adjustable impedance devices each having an adjustable reactance. Adjusting a single-input-port and single-output-port tunable matching circuit means adjusting the reactance of one or more of its adjustable impedance devices. A single-input-port and single-output-port tunable matching circuit may be used for tuning an impedance. To tune an impedance, the single-input-port and single-output-port tunable matching circuit must be properly adjusted.

In what follows, an automatic tuning system is an apparatus which can automatically adjust a single-input-port and single-output-port tunable matching circuit. When it is intended to be inserted between an antenna and a wireless transmitter, the automatic tuning system is sometimes referred to as "automatic antenna tuner" or as "adaptive impedance matching module". An automatic tuning system is indeed adaptive, in the sense that some circuit parameters, namely the reactances of adjustable impedance devices, are varied with time as a function of circuit variables such as sensed voltages or currents.

Many automatic tuning systems have been described, which use one or more real quantities depending on the impedance presented by the input port, these real quantities being processed to obtain "tuning control signals", the tuning control signals being used to control the reactances of the adjustable impedance devices of a single-input-port and single-output-port tunable matching circuit.

The block diagram of a prior art automatic tuning system having a user port and a target port is shown in FIG. 1. The automatic tuning system shown in FIG. 1 allows, at a given frequency, a transfer of power from the user port (5) to the target port (6), the automatic tuning system comprising:

- a sensing unit (1) delivering one or more "sensing unit output signals", each of the sensing unit output signals being mainly determined by one or more electrical variables sensed at the user port;
- a signal processing unit (2) estimating one or more real quantities depending on an impedance presented by the user port, using the sensing unit output signals obtained while an excitation is applied to the user port, the signal processing unit producing an output signal;
- a single-input-port and single-output-port tunable matching circuit (4) comprising one or more adjustable impedance devices, the one or more adjustable impedance devices being such that, at said given frequency, each of the one or more adjustable impedance devices has a reactance, the reactance of any one of the one or more adjustable impedance devices having an influence on the impedance presented by the user port, the reactance of any one of the one or more adjustable impedance devices being adjustable by electrical means; and
- a tuning control unit (3), the tuning control unit receiving the output signal of the signal processing unit, the tuning control unit delivering one or more "tuning control signals" to the single-input-port and single-output-port tunable matching circuit, the reactance of each of the one or more adjustable impedance devices being mainly determined by at least one of the one or more tuning control signals.

In FIG. 1, the output port of the single-input-port and single-output-port tunable matching circuit is directly coupled to the target port (6), and the input port of the single-input-port and single-output-port tunable matching circuit is indirectly coupled to the user port (5), through the sensing unit (1). The sensing unit is such that each of said one or more real quantities depending on an impedance presented by the user port is also a real quantity depending on the impedance presented by the input port (of the single-input-port and single-output-port tunable matching circuit). In fact, the sensing unit is typically such that the impedance presented by the user port approximates the impedance presented by this input port.

For instance, in an automatic tuning system disclosed in U.S. Pat. No. 2,523,791, entitled "Automatic Tuning System", in an automatic tuning system disclosed in U.S. Pat. No. 2,745,067, entitled "Automatic Impedance Matching Apparatus", and in an automatic tuning system disclosed in U.S. Pat. No. 3,443,231, entitled "Impedance Matching System", the wanted impedance is a resistance. We shall use $R_0$ to denote this resistance. In each of these apparatuses, a voltage v and a current i are sensed at a given point in a circuit, the impedance presented by the user port being $Z=v/i$. In each of these apparatuses, the real quantities depending on the impedance presented by the user port are a voltage determined by the phase of v relative to i, this phase being equal to the argument of Z, and a voltage substantially proportional to the difference $|v|-R_0|i|$. In each of these apparatuses, the second real quantity depending on the impedance presented by the user port is substantially equal to zero if the impedance presented by the user port is substantially equal to the wanted impedance, but the converse is not true. In the case of said U.S. Pat. No. 2,745,067 and U.S. Pat. No. 3,443,231, the two real quantities depending on the impedance presented by the user port are substantially equal to zero if and only if the impedance presented by the user port is substantially equal to the wanted impedance.

The automatic tuning systems disclosed in said U.S. Pat. No. 2,523,791 and U.S. Pat. No. 2,745,067 each corresponds to the block diagram shown in FIG. 1. In the case of said U.S. Pat. No. 3,443,231, two other real quantities representative of an impedance other than the impedance presented by the user port are also used to obtain the tuning control signals. Thus, the block diagram shown in FIG. 1 is not applicable to the automatic tuning system disclosed in said U.S. Pat. No. 3,443,231. However, a specialists sees that it is possible to consider that the automatic tuning system disclosed in said U.S. Pat. No. 3,443,231 is in fact composed of two automatic tuning systems each corresponding to the block diagram shown in FIG. 1.

For instance, in an automatic tuning system disclosed in U.S. Pat. No. 4,356,458, entitled "Automatic Impedance Matching Apparatus" and in an automatic tuning system disclosed in U.S. Pat. No. 5,225,847 entitled "Automatic Antenna Tuning System", two voltages are sensed: a voltage substantially proportional to the absolute value of a complex incident voltage at the user port (an incident voltage is also referred to as forward voltage), and a voltage substantially proportional to the absolute value of a complex reflected voltage at the user port. Using the same notations as above, $v_F$ to denote the complex incident voltage at the user port, and $v_R$ to denote the complex reflected voltage at the user port, the specialist understands that said absolute values are given by $|v_F|=v+R_0 i|/2$ and $|v_R|=v-R_0 i|/2$, respectively. In each of these apparatuses, a single real quantity depending on the impedance presented by the user port is used. It is a number processed in a digital circuit. In one of these apparatuses, this number is substantially equal to the ratio of the absolute value of the complex reflected voltage to the absolute value of the complex incident voltage, that is to say, to $|v_R|/|v_F|$. In the other of these apparatuses, this number is substantially equal to the squared inverse of this ratio, that is to say, to $|v_F|^2/|v_R|^2$.

For instance, in an automatic tuning system disclosed in U.S. Pat. No. 4,493,112, entitled "Antenna Tuner Discriminator", two complex voltages are sensed: a voltage substantially proportional to an incident voltage at the user port, and a voltage substantially proportional to a reflected voltage at the user port. Using the incident voltage as reference for the phase, a voltage proportional to the real part of the reflected voltage and a voltage proportional to the imaginary part of the reflected voltage are obtained. In this apparatus, the real quantities depending on the impedance presented by the user port are the voltage proportional to the real part of the reflected voltage and the voltage proportional to the imaginary part of the reflected voltage. In this apparatus, the two real quantities depending on the impedance presented by the user port are substantially equal to zero if and only if the impedance presented by the user port is substantially equal to the wanted impedance.

In the apparatuses disclosed in said U.S. Pat. No. 4,356,458 and U.S. Pat. No. 5,225,847, a digital feedback loop involving sequential logic must be used to obtain the tuning control signals and tune the impedance presented by the user port, because the single real quantity depending on the impedance presented by the user port does not provide a full information on the impedance presented by the user port. In the other apparatuses considered above, a faster tuning can be obtained, because two real quantities depending on the impedance presented by the user port provide a full information on the impedance presented by the user port, so that a simple degenerative feedback loop can be used to obtain the tuning control signals and tune the impedance presented by the user port.

The automatic tuning systems disclosed in said U.S. Pat. No. 4,356,458, U.S. Pat. No. 4,493,112 and U.S. Pat. No. 5,225,847 each corresponds to the block diagram shown in FIG. 1.

The automatic tuning system shown in FIG. 1 uses a closed-loop control scheme, in which the real quantities depending on the impedance presented by the user port are used to obtain tuning control signals, which determine the reactance of each of the adjustable impedance devices, and which therefore determine the impedance presented by the user port. The specialist understands that an automatic tuning system using real quantities depending on the impedance presented by the user port which provide a full information on the impedance presented by the user port, can achieve the fastest tuning if, based on this full information obtained at a given time for known tuning control signals and on a model of the single-input-port and single-output-port tunable matching circuit, it computes the values of the tuning control signals needed to obtain an exact tuning and quickly delivers the corresponding tuning control signals. In this case, the computation is very difficult, because there is no direct relationship between the real quantities depending on the impedance presented by the user port and the reactance value that each of the adjustable impedance devices should take on after having been adjusted. Thus, the automatic tuning system shown in FIG. 1 is slow or it requires very difficult computations. Moreover, it can be shown that an adjustment of a single-input-port and single-output-port tunable matching circuit obtained using the automatic tuning system shown in FIG. 1 need not be optimal when the losses in the single-input-port and single-output-port tunable matching circuit are not very small.

The block diagram of another prior art automatic tuning system having a user port and a target port is shown in FIG. 2. The automatic tuning system shown in FIG. 2 allows, at a given frequency, a transfer of power from the user port (5) to the target port (6), the automatic tuning system comprising:

a sensing unit (1) delivering one or more "sensing unit output signals", each of the sensing unit output signals being mainly determined by one or more electrical variables sensed at the target port;

a signal processing unit (2) estimating one or more real quantities depending on an impedance seen by the target port, using the sensing unit output signals obtained while an excitation is applied to the user port, the signal processing unit producing an output signal;

a single-input-port and single-output-port tunable matching circuit (4) comprising one or more adjustable impedance devices, the one or more adjustable impedance devices being such that, at said given frequency, each of the one or more adjustable impedance devices has a reactance, the reactance of any one of the one or more adjustable impedance devices having an influence on the impedance presented by the user port, the reactance of any one of the one or more adjustable impedance devices being adjustable by electrical means; and a tuning control unit (3), the tuning control unit receiving the output signal of the signal processing unit, the tuning control unit delivering one or more "tuning control signals" to the single-input-port and single-output-port tunable matching circuit, the reactance of each of the one or more adjustable impedance devices being mainly determined by at least one of the one or more tuning control signals.

In FIG. 2, the output port of the single-input-port and single-output-port tunable matching circuit is indirectly coupled to the target port (6), through the sensing unit (1), and the input port of the single-input-port and single-output-port tunable matching circuit is directly coupled to the user port (5). The sensing unit is such that each of said one or more real quantities depending on an impedance seen by the target port is also a real quantity depending on the impedance seen by the output port (of the single-input-port and single-output-port tunable matching circuit). In fact, the sensing unit is typically such that the impedance seen by the target port approximates the impedance seen by this output port.

For instance, in an automatic tuning system disclosed in U.S. Pat. No. 5,564,086, entitled "Method and apparatus for enhancing an operating characteristic of a radio transmitter" and in an automatic tuning system disclosed in U.S. Pat. No. 6,414,562, entitled "Circuit and method for impedance matching", two voltages are sensed: a voltage substantially proportional to the complex incident voltage at the target port, denoted by $u_F$, and a voltage substantially proportional to the complex reflected voltage at the target port, denoted by $u_R$. In said U.S. Pat. No. 5,564,086, the real quantities depending on an impedance seen by the target port are the absolute value and the phase of the ratio of the complex reflected voltage to the complex incident voltage, that is to say, of the ratio $u_R/u_F$. In said U.S. Pat. No. 6,414,562, the real quantities depending on an impedance seen by the target port are the difference of the absolute values of $u_F$ and $u_R$, that is to say, $|u_F|-|u_R|$, and a real function of the phase difference between $u_F$ and $u_R$, this function being produced by a phase comparator.

The automatic tuning systems disclosed in said U.S. Pat. No. 5,564,086 and U.S. Pat. No. 6,414,562 each corresponds to the block diagram shown in FIG. 2.

The automatic tuning system shown in FIG. 2 uses an open-loop control scheme, in which the real quantities depending on an impedance seen by the target port are used to obtain tuning control signals, the tuning control signals having no influence on the impedance seen by the target port. The specialist understands that such an open-loop control scheme automatic tuning system is explicitly or implicitly based on a model of the single-input-port and single-output-port tunable matching circuit. Using the knowledge of the frequency of operation and of the real quantities depending on the impedance seen by the target port, the automatic tuning system determines the values of the tuning control signals. This does not require a difficult computation. For instance, only simple interpolations are needed if a lookup table (also spelled "look-up table") is used to obtain tuning control signals, based on the frequency of operation and on the real quantities depending on an impedance seen by the target port. Unfortunately, the automatic tuning system shown in FIG. 2 often only provides an inaccurate tuning, so that the impedance presented by the user port is not optimal.

Consequently, there is no known solution to the problem of optimally, quickly and automatically adjusting a single-input-port and single-output-port tunable matching circuit, without very difficult computations, or when the losses in the single-input-port and single-output-port tunable matching circuit are not very small.

SUMMARY OF THE INVENTION

The purpose of the invention is a method of automatic adjustment of a single-input-port and single-output-port tunable matching circuit, without the above-mentioned limitations of known techniques, and also an automatic tuning system using this method.

In what follows, X and Y being different quantities or variables, performing an action as a function of X does not preclude the possibility of performing this action as a function of Y. In what follows, "having an influence" and "having an effect" have the same meaning. In what follows, "coupled", when applied to two ports, may indicate that the ports are directly coupled, in which case each terminal of one of the ports is connected to (or, equivalently, in electrical contact with) one and only one terminal of the other port, and/or that the ports are indirectly coupled, in which case an electrical interaction different from direct coupling exists between the ports, for instance through one or more components.

The method of the invention is a method for automatic adjustment of a single-input-port and single-output-port tunable matching circuit, the single-input-port and single-output-port tunable matching circuit being a part of an automatic tuning system having a "user port" and a "target port", the automatic tuning system allowing, at a given frequency, a transfer of power from the user port to the target port, the single-input-port and single-output-port tunable matching circuit comprising one or more adjustable impedance devices, the one or more adjustable impedance devices being referred to as "the adjustable impedance devices of the tunable matching circuit" and being such that, at said given frequency, each of the adjustable impedance devices of the tunable matching circuit has a reactance, the reactance of any one of the adjustable impedance devices of the tunable matching circuit being adjustable by electrical means, the reactance of each of the adjustable impedance devices of the tunable matching circuit being mainly determined by one or more "tuning control signals", the method comprising the steps of:

applying an excitation to the user port;

sensing one or more electrical variables at the target port while the excitation is applied, to obtain one or more "sensing unit output signals", each of the one or more sensing unit output signals being mainly determined by at least one of the one or more electrical variables sensed at the target port;

generating, for each of the one or more tuning control signals, an initial value of said each of the one or more tuning control signals, as a function of one or more real quantities depending on an impedance seen by the target port, said one or more real quantities depending on an impedance seen by the target port being estimated as a function of one or more of the one or more sensing unit output signals, open-loop control being utilized to generate said initial value of said each of the one or more tuning control signals; and generating, for one or more of the one or more tuning control signals, at least one subsequent value of each of said one or more of the one or more tuning control signals, an extremum-seeking control algorithm being utilized to generate said at least one subsequent value of each of said one or more of the one or more tuning control signals, the extremum-seeking control algorithm seeking to maximize or to minimize a performance variable by controlling said one or more of the one or more tuning control signals, the performance variable being estimated as a function of one or more of the one or more sensing unit output signals.

According to the invention, the given frequency is for instance a frequency greater than or equal to 150 kHz. We will use $Z_{Sant}$ to denote the impedance seen by the target port and $Z_U$ to denote the impedance presented by the user port. $Z_{Sant}$ and $Z_U$ are frequency dependent complex numbers. Thus, the impedance seen by the target port may be referred to as "complex impedance seen by the target port". Said transfer of power from the user port to the target port may be a transfer of power with small or negligible or zero losses, this characteristic being preferred.

Each of said one or more real quantities depending on an impedance seen by the target port may for instance be a real quantity representative of the impedance seen by the target port. Each of said one or more real quantities depending on an impedance seen by the target port may for instance be substantially proportional to the absolute value, or the phase, or the real part, or the imaginary part of the impedance seen by the target port, or of the inverse of the impedance seen by the target port (that is, the admittance seen by the target port), or of a voltage reflection coefficient at the target port, defined as being equal to $(Z_{Sant}-Z_O)(Z_{Sant}+Z_O)^{-1}$, where $Z_O$ is a reference impedance.

An adjustable impedance device is a component comprising two terminals which substantially behave as the terminals of a passive linear two-terminal circuit element, and which are consequently fully characterized by an impedance which may depend on frequency, this impedance being adjustable. An adjustable impedance device may be adjustable by mechanical means, for instance a variable resistor, a variable capacitor, a network comprising a plurality of capacitors and one or more switches or change-over switches used to cause different capacitors of the network to contribute to the reactance, a variable inductor, a network comprising a plurality of inductors and one or more switches or change-over switches used to cause different inductors of the network to contribute to the reactance, or a network comprising a plurality of open-circuited or short-circuited stubs and one or more switches or change-over switches used to cause different stubs of the network to contribute to the reactance. We note that all examples in this list, except the variable resistor, are intended to provide an adjustable reactance.

An adjustable impedance device having a reactance which is adjustable by electrical means may be such that it only provides, at said given frequency, a finite set of reactance values, this characteristic being for instance obtained if the adjustable impedance device is:

a network comprising a plurality of capacitors or open-circuited stubs and one or more electrically controlled switches or change-over switches, such as electromechanical relays, or microelectromechanical switches (MEMS switches), or PIN diodes, or insulated-gate field-effect transistors (MOSFETs), used to cause different capacitors or open-circuited stubs of the network to contribute to the reactance; or a network comprising a plurality of coils or short-circuited stubs and one or more electrically controlled switches or change-over switches used to cause different coils or short-circuited stubs of the network to contribute to the reactance.

An adjustable impedance device having a reactance which is adjustable by electrical means may be such that it provides, at said given frequency, a continuous set of reactance values, this characteristic being for instance obtained if the adjustable impedance device is based on the use of a variable capacitance diode; or a MOS varactor; or a microelectromechanical varactor (MEMS varactor); or a ferroelectric varactor.

Extremum-seeking control algorithms are well known to specialists. Extremum-seeking control is a family of non-linear control methods whose purpose is to autonomously find a maximum or a minimum of a performance variable, the performance variable being a real function of one or more outputs of a controlled system, by controlling one or more inputs of the controlled system. In extremum-seeking control algorithms, one or more signals varying over time are caused to appear at these one or more inputs of the controlled system, in a way that allows the algorithm to probe the nonlinearity of the performance variable with respect to the one or more inputs of the controlled system, and to get closer to an extremum. Thus, extremum-seeking control algorithms are based on the information that the extremum exists, but they do not need an exact knowledge of the controlled system to find the extremum. For this reason, extremum seeking control is said to be a non-model-based real-time optimization approach. For instance, the book of K. B. Ariyur and M. Krstic, entitled "Real-Time Optimization by Extremum-Seeking Control" and published by Wiley-Interscience in 2003, describes a type of extremum-seeking control which uses one or more periodical perturbations (for instance sinusoidal perturbations), and which is usually referred to as perturbation based extremum-seeking control. For instance, the book of S.-J. Liu and M. Krstic, entitled "Stochastic Averaging and Stochastic Extremum Seeking" and published by Springer-Verlag in 2012, describes a type of extremum-seeking control which uses one or more stochastic perturbations (for instance random perturbations), and which is usually referred to as stochastic extremum-seeking control. There are many other types of extremum-seeking control, such as sliding mode extremum-seeking control, neural network extremum-seeking control, relay extremum seeking control, perturb and observe, numerical optimization based extremum-seeking control, etc, which are well known to specialists. For instance, the article of B. Calli, W. Caarls, P. Jonker and M. Wisse, entitled "Comparison of Extremum Seeking Control Algorithms for Robotic Applications" and published in *Proc. of the 2012 IEEE/RSJ International Conference on Intelligent Robots and Systems*, at the pages 3195-3202, in October 2012, and the article of C. Olalla, M. I. Arteaga, R. Leyva and A. E. Aroudi, entitled "Analysis and Comparison of Extremum Seeking Control Techniques" and published in *Proc. 2007 IEEE International Symposium on Industrial Electronics*, at the pages 72-76, in June 2007, present interesting comparisons of some types of extremum seeking control.

Since, according to the invention, the extremum-seeking control algorithm seeks to maximize or to minimize a performance variable by controlling said one or more of the one or more tuning control signals, the specialist understands that, in the context of the present invention, it is possible to consider that said one or more inputs of the controlled system are said one or more of the one or more tuning control signals. Thus, the extremum-seeking control algorithm controls and varies said one or more of the one or more tuning control signals over time, to get closer to an extremum (i.e., a maximum or a minimum) of the performance variable.

According to the invention, the performance variable is estimated as a function of one or more of the one or more sensing unit output signals. Thus, the performance variable depends on at least one of the one or more electrical variables sensed at the target port. For instance, it is possible that the performance variable is a real quantity depending on an absolute value of a voltage at the target port, or a real quantity representative of the absolute value of the voltage at the target port. Said real quantity depending on an absolute value of a voltage at the target port may for instance be substantially proportional to the absolute value of a voltage at the target port, or to the square of the absolute value of a voltage at the target port, or to the absolute value of a current at the target port, or to the square of the absolute value of a current at the target port, or to an average power delivered by the target port, or to the absolute value of an incident voltage at the target port, or to the square of the absolute value of an incident voltage at the target port, or to the absolute value of an incident current at the target port, or to the square of the absolute value of an incident current at the target port. Thus, it is for instance possible that the performance variable is a real quantity depending on, and/or representative of, the absolute value of a voltage at the target port, or the absolute value of a current at the target port, or an average power delivered by the target port, or the absolute value of an incident voltage at the target port, or the absolute value of an incident current at the target port.

According to the invention, it is for instance possible that the extremum-seeking control algorithm ends when a termination criterion is met. In other words, it is for instance possible that the extremum-seeking control algorithm stops seeking to maximize or to minimize the performance variable when a termination criterion is met. For instance, the termination criterion may be that the extremum-seeking control algorithm has been operating for a specified time. For instance, in the case where the extremum-seeking control algorithm seeks to minimize the performance variable, the termination criterion may be that the performance variable does not decrease rapidly (so that it may be reasonable to infer that the performance variable is near a minimum). For instance, in the case where the extremum-seeking control algorithm seeks to maximize the performance variable, the termination criterion may be that the performance variable does not increase rapidly (so that it may be reasonable to infer that the performance variable is near a maximum). For instance, the termination criterion may be that a termination request has been received.

While the extremum-seeking control algorithm seeks to maximize or to minimize the performance variable, it is possible that this control algorithm varies said one or more of the one or more tuning control signals over time, so that it is possible that the impedance presented by the user port varies over time, and that the performance variable varies over time. This may be detrimental for the operation of an apparatus comprising said automatic tuning system. For instance, if said apparatus is a radio receiver or a radio transmitter or a radio transceiver, such variations may cause an unwanted fading. Thus, a possible advantage of a possible end of the extremum-seeking control algorithm is that the extremum-seeking control algorithm no longer varies said one or more of the one or more tuning control signals over time.

Some prior art methods for automatically adjusting a single-input-port and single-output-port tunable matching circuit use an extremum-seeking control algorithm. For instance, the chapter 7 of the book of C. Zhang and R. Ordóñez, entitled "Extremum-Seeking Control and Application" and published by Springer-Verlag in 2012, explains how an extremum-seeking control algorithm can be used to automatically adjust a single-input-port and single-output-port tunable matching circuit, the extremum-seeking control algorithm seeking to reduce or minimize a reflected power at the user port. Likewise, the apparatuses disclosed in said U.S. Pat. No. 4,356,458 and U.S. Pat. No. 5,225,847 use an extremum-seeking control algorithm which seeks to minimize a real quantity depending on a reflection coefficient at the user port or on a standing wave ratio at the user port. These prior art methods for automatically adjusting a single-input-port and single-output-port tunable matching circuit do not have the following characteristics of the method of the invention:

in the invention, the extremum-seeking control algorithm is used after, for each of the one or more tuning control signals, an initial value of said each of the one or more tuning control signals has been generated, as a function of one or more real quantities depending on an impedance seen by the target port;

in the invention, the extremum-seeking control algorithm seeks to maximize or to minimize a performance variable estimated as a function of one or more sensing unit output signals mainly determined by one or more electrical variables sensed at the target port.

As shown in the following embodiments, these characteristics are such that the invention can be used to optimally, quickly and automatically adjust a single-input-port and single-output-port tunable matching circuit, without very difficult computations, in spite of the presence of losses in the single-input-port and single-output-port tunable matching circuit. This result is closely related to the fact that the invention combines an open-loop control scheme and a closed-loop control scheme, both using one or more electrical variables sensed at the target port. More precisely:

the above-defined step of generating, for each of the one or more tuning control signals, an initial value of said each of the one or more tuning control signals, uses an open-loop control scheme, in which said one or more real quantities depending on an impedance seen by the target port are used to obtain the one or more initial values of the one or more tuning control signals, the one or more initial values of the one or more tuning control signals having no influence on the impedance seen by the target port; and the above-defined step of generating, for one or more of the one or more tuning control signals, at least one subsequent value of each of said one or more of the one or more tuning control signals, uses an extremum-seeking control algorithm, which uses a closed-loop control scheme.

The specialist understands that the characteristics of the open-loop control scheme and of the closed-loop control scheme interact to provide the accuracy and the speed of the automatic adjustment of the single-input-port and singleoutput-port tunable matching circuit. However, to a limited extent, it may be possible to consider that, in the invention, the high accuracy of the automatic adjustment of the single-input-port and single-output-port tunable matching circuit is mainly obtained with said step of generating, for one or more of the one or more tuning control signals, at least one subsequent value of each of said one or more of the one or more tuning control signals (closed-loop control scheme), and that the high speed of this automatic adjustment is mainly a consequence of the use of said step of generating, for each of the one or more tuning control signals, an initial value of said each of the one or more tuning control signals (open-loop control scheme). In particular, a faster adjustment of the single-input-port and single-output-port tunable matching circuit may typically be obtained if the initial values of the one or more tuning control signals are closer to the values corresponding to the wanted extremum (maximum or minimum) of the performance variable. According to the invention, as explained in the first embodiment, initial values of the one or more tuning control signals which are close to the values corresponding to this wanted extremum can for instance be obtained if:

- the number of said one or more sensing unit output signals is greater than or equal to 2;
- the number of said one or more real quantities depending on an impedance seen by the target port is greater than or equal to 2; and
- said one or more real quantities depending on an impedance seen by the target port are sufficient for being able to compute a real part and an imaginary part of the impedance seen by the target port.

An apparatus implementing the method of the invention is an automatic tuning system having a "user port" and a "target port", the automatic tuning system allowing, at a given frequency, a transfer of power from the user port to the target port, the automatic tuning system comprising:

- a sensing unit, the sensing unit delivering one or more "sensing unit output signals", each of the one or more sensing unit output signals being mainly determined by one or more electrical variables sensed at the target port while an excitation is applied to the user port;
- a single-input-port and single-output-port tunable matching circuit, the single-input-port and single-output-port tunable matching circuit comprising one or more adjustable impedance devices, the one or more adjustable impedance devices being referred to as "the adjustable impedance devices of the tunable matching circuit" and being such that, at said given frequency, each of the adjustable impedance devices of the tunable matching circuit has a reactance, the reactance of any one of the adjustable impedance devices of the tunable matching circuit being adjustable by electrical means;
- a signal processing unit, the signal processing unit delivering "tuning instructions", at least one of the tuning instructions being an "initial tuning instruction", each of the one or more initial tuning instructions being determined as a function of one or more real quantities depending on an impedance seen by the target port, said one or more real quantities depending on an impedance seen by the target port being estimated as a function of one or more of the one or more sensing unit output signals, the automatic tuning system being such that open-loop control is utilized to determine each of the one or more initial tuning instructions, at least one of the tuning instructions being a "subsequent tuning instruction", the signal processing unit performing an extremum-seeking control algorithm to determine each of the one or more subsequent tuning instructions, the extremum-seeking control algorithm seeking to maximize or to minimize a performance variable, the performance variable being estimated as a function of one or more of the one or more sensing unit output signals; and
- a tuning control unit, the tuning control unit receiving the tuning instructions from the signal processing unit, the tuning control unit delivering one or more "tuning control signals" to the single-input-port and single-output-port tunable matching circuit, the tuning control unit generating, for each of the one or more tuning control signals, one or more values of said each of the one or more tuning control signals, said one or more values of said each of the one or more tuning control signals being determined as a function of at least one of the tuning instructions, the reactance of each of the adjustable impedance devices of the tunable matching circuit being mainly determined by at least one of the one or more tuning control signals.

For instance, each of said electrical variables may be a voltage, or an incident voltage, or a reflected voltage, or a current, or an incident current, or a reflected current. For instance, the tuning control unit may be such that:

- for each of the one or more tuning control signals, said one or more values of said each of the one or more tuning control signals comprise an initial value determined as a function of one of the one or more initial tuning instructions; and
- for one or more of the one or more tuning control signals, said one or more values of each said one or more of the one or more tuning control signals comprise at least one subsequent value determined as a function of one of the one or more subsequent tuning instructions.

In this case, it is for instance possible to say that the tuning control unit generates: for each of the one or more tuning control signals, an initial value determined as a function of one of the one or more initial tuning instructions; and, for one or more of the one or more tuning control signals, at least one subsequent value determined as a function of one of the one or more subsequent tuning instructions.

As explained above, it is for instance possible that:

- the number of said one or more sensing unit output signals is greater than or equal to 2;
- the number of said one or more real quantities depending on an impedance seen by the target port is greater than or equal to 2; and
- said one or more real quantities depending on an impedance seen by the target port are sufficient for being able to compute a real part and an imaginary part of the impedance seen by the target port.

It is assumed that said single-input-port and single-output-port tunable matching circuit behaves, at said given frequency, with respect to its input port and output port, substantially as a passive linear 2-port device, where "passive" is used in the meaning of circuit theory. As a consequence of linearity, it is possible to define the impedance presented by the input port. As a consequence of passivity, the single-input-port and single-output-port tunable matching circuit does not provide amplification, its power gain is less than or equal to 1 and its transducer power gain is less than or equal to 1. The specialist understands that this linearity with respect to these input port and output port does not contradict the above-mentioned nonlinearity of the performance variable with respect to the one or more inputs of the controlled system (since one may consider that each input of the controlled system is one of the tuning control signals).

It is possible that the input port of the single-input-port and single-output-port tunable matching circuit is coupled, directly or indirectly, to the user port. It is possible that the output port of the single-input-port and single-output-port tunable matching circuit is coupled, indirectly through the sensing unit, to the target port. Thus, in this case, said transfer of power from the user port to the target port may take place through the single-input-port and single-output-port tunable matching circuit and through the sensing unit.

The specialist understands that the automatic tuning system of the invention is adaptive in the sense that circuit parameters, namely the reactances of the adjustable impedance devices of the tunable matching circuit, are varied with time as a function of the sensing unit output signals, which are each mainly determined by one or more electrical variables.

BRIEF DESCRIPTION OF THE DRAWINGS

Other advantages and characteristics will appear more clearly from the following description of particular embodiments of the invention, given by way of non-limiting examples, with reference to the accompanying drawings in which:

FIG. 6 shows a flowchart implemented in an automatic tuning system of the invention (fourth embodiment);

FIG. 7 shows a flowchart implemented in an automatic tuning system of the invention (fifth embodiment);

DETAILED DESCRIPTION OF SOME EMBODIMENTS

First Embodiment

Figure 1:
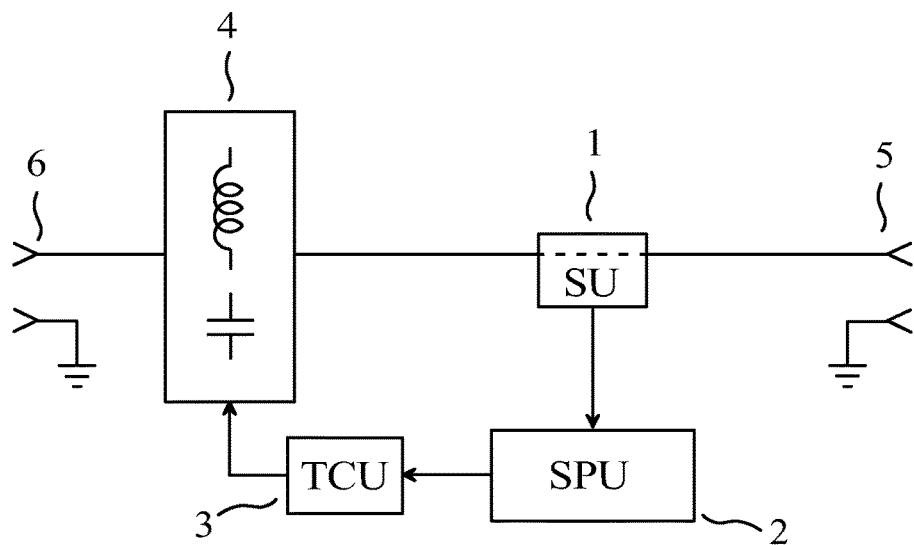
FIG. 1 shows the block diagram of an automatic tuning system, which has already been discussed in the section dedicated to the presentation of the prior art.
Figure 2:
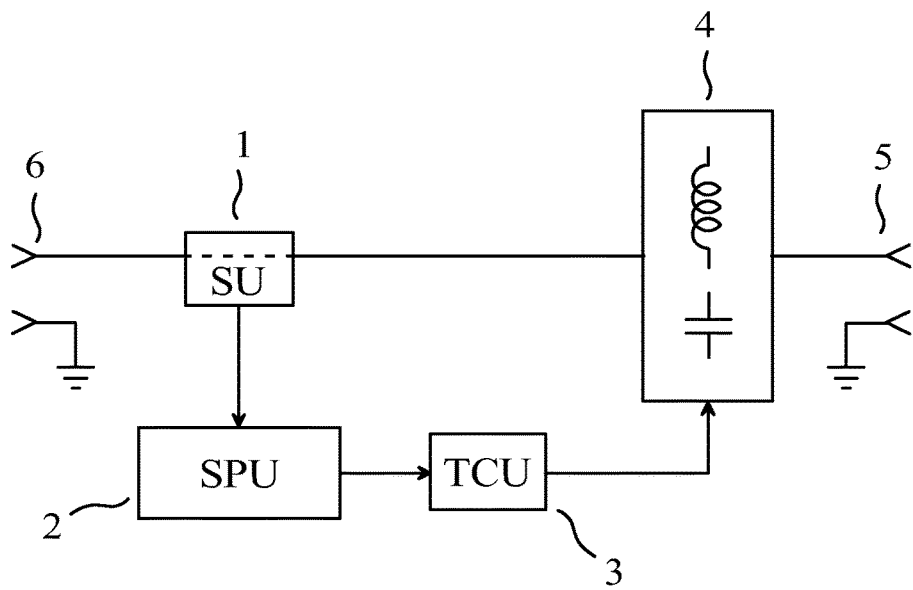
FIG. 2 shows the block diagram of an automatic tuning system, which has already been discussed in the section dedicated to the presentation of the prior art.

As a first embodiment of a device of the invention, given by way of non-limiting example, we have represented in FIG. 2 the block diagram of an automatic tuning system having one user port (5) and one target port (6), the automatic tuning system allowing, at a given frequency greater than or equal to 30 MHz, a transfer of power from the user port to the target port, the automatic tuning system comprising:

a sensing unit (1), the sensing unit delivering two "sensing unit output signals", each of the sensing unit output signals being determined by an electrical variable sensed at the target port while an excitation is applied to the user port;

a single-input-port and single-output-port tunable matching circuit (4), the single-input-port and single-output-port tunable matching circuit comprising one or more adjustable impedance devices, the one or more adjustable impedance devices being referred to as "the adjustable impedance devices of the tunable matching circuit" and being such that, at said given frequency, each of the adjustable impedance devices of the tunable matching circuit has a reactance, the reactance of any one of the adjustable impedance devices of the tunable matching circuit being adjustable by electrical means;

a signal processing unit (2), the signal processing unit delivering "tuning instructions", at least one of the tuning instructions being an "initial tuning instruction", each of the one or more initial tuning instructions being determined as a function of two or more real quantities depending on an impedance seen by the target port, said two or more real quantities depending on an impedance seen by the target port being estimated using the sensing unit output signals, at least one of the tuning instructions being a "subsequent tuning instruction", each of the one or more subsequent tuning instructions being determined by utilizing an extremum-seeking control algorithm, the extremum-seeking control algorithm seeking to either maximize or minimize a performance variable, the performance variable being estimated as a function of one or more of the sensing unit output signals; and a tuning control unit (3), the tuning control unit receiving the tuning instructions from the signal processing unit, the tuning control unit delivering one or more "tuning control signals" to the single-input-port and single-output-port tunable matching circuit, the tuning control unit generating, for each of the one or more tuning control signals, one or more values of said each of the one or more tuning control signals, each of said one or more values of said each of the one or more tuning control signals being determined as a function of at least one of the tuning instructions, the reactance of each of the adjustable impedance devices of the tunable matching circuit being mainly determined by at least one of the one or more tuning control signals.

The two or more real quantities depending on an impedance seen by the target port are such that they are sufficient for being able to compute the impedance seen by the target port. In other words, they are such that they are sufficient for allowing a computation of the impedance seen by the target port. The wording "such that they are sufficient for being able to compute the impedance seen by the target port" does not imply that the impedance seen by the target port is computed, but it is possible that the impedance seen by the target port is computed. Since, in the two previous sentences, "impedance" means "complex impedance", the requirement "the two or more real quantities depending on an impedance seen by the target port are such that they are sufficient for being able to compute the impedance seen by the target port" is equivalent to "the two or more real quantities depending on an impedance seen by the target port are such that they are sufficient for being able to compute a real part and an imaginary part of the impedance seen by the target port". The wording "such that they are sufficient for being able to compute a real part and an imaginary part of the impedance seen by the target port" does not imply that the real part and the imaginary part of the impedance seen by the target port are computed, but it is possible that the real part and the imaginary part of the impedance seen by the target port are computed.

The information carried by the sensing unit output signals must be sufficient to allow the signal processing unit to estimate two or more real quantities depending on an impedance seen by the target port, the two or more real quantities depending on an impedance seen by the target port being such that they are sufficient for being able to compute the impedance seen by the target port. The sensing unit (1) may for instance be such that the two sensing unit output signals comprise: a first sensing unit output signal proportional to a first electrical variable, the first electrical variable being a voltage across the target port; and a second sensing unit output signal proportional to a second electrical variable, the second electrical variable being a current flowing out of the target port. Said voltage across the target port may be a complex voltage and said current flowing out of the target port may be a complex current. Alternatively, the sensing unit (1) may for instance be such that the two sensing unit output signals comprise: a first sensing unit output signal proportional to a first electrical variable, the first electrical variable being an incident voltage (which may also be referred to as "forward voltage") at the target port; and a second sensing unit output signal proportional to a second electrical variable, the second electrical variable being a reflected voltage at the target port. Said incident voltage at the target port may be a complex incident voltage and said reflected voltage at the target port may be a complex reflected voltage.

Each of the electrical variables is substantially zero if no signal is applied to the user port and if no signal is applied to the target port.

An external device has an output port, the output port of the external device being coupled to the user port. The external device is not shown in FIG. 2. The external device applies the excitation to the user port. The external device also delivers one or more "instructions of the external device" to the signal processing unit (2), said instructions of the external device informing the signal processing unit that said excitation has been applied, or is being applied, or will be applied. For instance, the external device may initiate a tuning sequence when it informs the signal processing unit that it will apply the excitation to the user port. For instance, the signal processing unit may terminate the tuning sequence when the extremum-seeking control algorithm ends because a termination criterion is met. Additionally, the external device provides one or more other signals to the signal processing unit, and/or receives one or more other signals from the signal processing unit. The electrical links needed to deliver said instructions of the external device and to carry such other signals are not shown in FIG. 2.

The excitation applied to the user port may for instance comprise a sinusoidal signal at said given frequency. The excitation applied to the user port may for instance comprise a sinusoidal signal at a frequency different from said given frequency, or a modulated sinusoidal signal. The two or more real quantities depending on an impedance seen by the target port may consist of a real number proportional to the real part of $Z_{Sant}$ and of a real number proportional to the imaginary part of $Z_{Sant}$. The specialist understands how the signal processing unit can process the sensing unit output signals, to obtain a real number proportional to the real part of $Z_{Sant}$ and a real number proportional to the imaginary part of $Z_{Sant}$. For instance, let us assume that the sensing unit delivers: a first sensing unit output signal proportional to the voltage across the target port; and a second sensing unit output signal proportional to the current flowing out of the target port. The signal processing unit may for instance perform an in-phase/quadrature (I/Q) demodulation (homodyne reception) of these sensing unit output signals, to obtain four analog signals. These analog signals may then be converted into digital signals and further processed in the digital domain, to estimate the real part of $Z_{Sant}$ and the imaginary part of $Z_{Sant}$.

Figure 3:
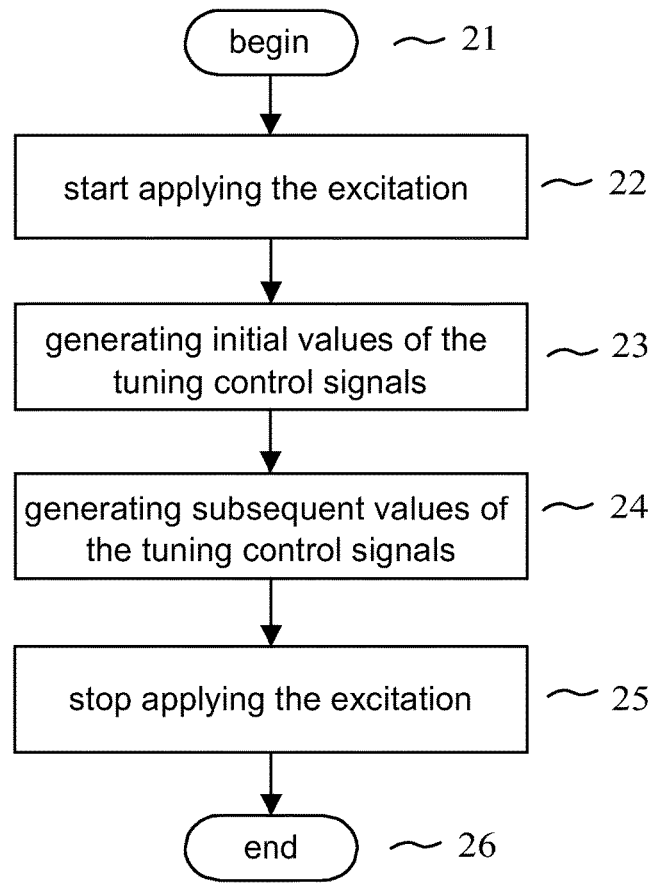
FIG. 3 shows a flowchart implemented in an automatic tuning system of the invention (first embodiment)

The tuning instructions may be of any type of digital message. In this first embodiment, the tuning instructions are delivered during one or more tuning sequences. A flowchart of one of the one or more tuning sequences is shown in FIG. 3. In addition to the begin symbol (21) and the end symbol (26), this flowchart comprises:

- a process "start applying the excitation" (22), in which the external device starts applying the excitation to the user port, so that the sensing unit becomes able to deliver said sensing unit output signals each determined by an electrical variable sensed at the target port while an excitation is applied to the user port;
- a process "generating initial values of the tuning control signals" (23), in which the signal processing unit delivers one said initial tuning instruction, and in which the tuning control unit generates, for each of the one or more tuning control signals, an initial value determined as a function of said one said initial tuning instruction;
- a process "generating subsequent values of the tuning control signals" (24), in which the signal processing unit delivers one or more said subsequent tuning instructions, and in which the tuning control unit generates, for each of the one or more tuning control signals, one or more subsequent values each determined as a function of one of said one or more said subsequent tuning instructions;
- a process "stop applying excitation" (25), in which the external device stops applying the excitation to the user port.

If the automatic tuning system has its target port directly or indirectly coupled to an antenna, the specialist understands that $Z_{Sant}$ depends on the frequency and on the electromagnetic characteristics of the volume surrounding the antenna. In particular, if the antenna is built in a portable transceiver, for instance a user equipment (UE) of an LTE-advanced wireless network, the body of the user has an effect on $Z_{Sant}$, and $Z_{Sant}$ depends on the position of the body of the user. This is referred to as "user interaction", or "hand effect" or "finger effect". The specialist understands that the automatic tuning system may be used to compensate a variation in $Z_{Sant}$ caused by a variation in the frequency of operation, and/or to compensate the user interaction.

In order to respond to variations in $Z_{Sant}$ and/or in an operating frequency, tuning sequences may take place repeatedly. For instance, a new tuning sequence may start periodically, for instance every 10 milliseconds.

The excitation has a carrier frequency. The excitation may for instance be an unmodulated carrier, the carrier frequency of the excitation being the frequency of said carrier. In this case, the excitation applied to the user port may be a sinusoidal signal whose frequency is the frequency of said carrier. The excitation may for instance be a modulated carrier, the carrier frequency of the excitation being the frequency of said carrier. In this case, the excitation applied to the user port may be a modulated sinusoidal signal.

The process "generating initial values of the tuning control signals" (23) uses an open-loop control scheme, in which said two or more real quantities depending on an impedance seen by the target port and a quantity depending on the carrier frequency of the excitation are used to obtain, for each of the one or more tuning control signals, an initial value (of course, this initial value has no influence on the impedance seen by the target port). In this process, the signal processing unit receives the value of the carrier frequency of the excitation, this value being a quantity depending on the carrier frequency of the excitation, this value being carried by one of said one or more other signals.

According to a first example of the process "generating initial values of the tuning control signals" (23), said one said initial tuning instruction is determined based on a model of the single-input-port and single-output-port tunable matching circuit, this model taking into account the influences of the carrier frequency of the excitation, of the two or more real quantities depending on an impedance seen by the target port, and of an initial tuning instruction, on a transducer power gain of the single-input-port and single-output-port tunable matching circuit. The specialist understands that this model may for instance comprise: for each of the adjustable impedance devices of the tunable matching circuit, a lookup table about the characteristics of said each of the adjustable impedance devices of the tunable matching circuit; and one or more formulas for computing the transducer power gain. The signal processing unit estimates the two or more real quantities depending on an impedance seen by the target port, and uses an "open-loop algorithm" to determine said one said initial tuning instruction, said one said initial tuning instruction being such that a predicted value of the transducer power gain of the single-input-port and single-output-port tunable matching circuit, determined based on the model, is as high as possible, at the carrier frequency of the excitation. This process requires neither difficult computations nor a long time, because the open-loop algorithm directly uses the value of the carrier frequency of the excitation and the two or more real quantities depending on an impedance seen by the target port, to determine said one said initial tuning instruction. This process quickly provides said one said initial tuning instruction, which is such that the transducer power gain is not very far from a maximum transducer power gain achievable with the single-input-port and single-output-port tunable matching circuit, at the carrier frequency of the excitation, because the two or more real quantities depending on an impedance seen by the target port are such that they are sufficient for being able to compute the impedance seen by the target port, at the carrier frequency of the excitation.

According to a second example of the process "generating initial values of the tuning control signals" (23), said one said initial tuning instruction is determined based on a model of the single-input-port and single-output-port tunable matching circuit, this model taking into account the influences of the carrier frequency of the excitation, of the two or more real quantities depending on an impedance seen by the target port, and of an initial tuning instruction, on the impedance presented by the user port $Z_U$. The specialist understands that this model may for instance comprise: for each of the adjustable impedance devices of the tunable matching circuit, a lookup table about the characteristics of said each of the adjustable impedance devices of the tunable matching circuit; and one or more formulas for computing the impedance presented by the user port. The signal processing unit uses an "open-loop algorithm" to determine said one said initial tuning instruction, said one said initial tuning instruction being such that a predicted absolute value of the difference between the impedance presented by the user port and a wanted impedance, determined based on the model, is as small as possible, at the carrier frequency of the excitation. A first possible open-loop algorithm may for instance use the formulas shown in Section VI of the article of F. Broydé and E. Clavelier entitled "Some Properties of Multiple-Antenna-Port and Multiple-User-Port Antenna Tuners", published in *IEEE Trans. on Circuits and Systems—I: Regular Papers*, Vol. 62, No. 2, pp. 423-432, in February 2015. This first possible open-loop algorithm does not take the losses of the single-input-port and single-output-port tunable matching circuit into account. A second possible open-loop algorithm may for instance use the iterative computation technique presented in Section 4 or Appendix C of the article of F. Broydé and E. Clavelier entitled "A Tuning Computation Technique for a Multiple-Antenna-Port and Multiple-User-Port Antenna Tuner", published in *International Journal of Antennas and Propagation*, in 2016. This second possible open-loop algorithm is more accurate than the first possible open-loop algorithm, because it takes the losses in the single-input-port and single-output-port tunable matching circuit into account. The specialist knows how to write such an algorithm. This process quickly provides said one said initial tuning instruction, which is such that the impedance presented by the user port is not very far from the wanted impedance, at the carrier frequency of the excitation, because the two or more real quantities depending on an impedance seen by the target port are such that they are sufficient for being able to compute the impedance seen by the target port, at the carrier frequency of the excitation.

Unfortunately, the process "generating initial values of the tuning control signals" (23) cannot be very accurate, because it does not take into account the effects of component tolerances, of component aging, of electromagnetic interactions, and of the component temperatures, on the characteristics of the single-input-port and single-output-port tunable matching circuit.

The process "generating subsequent values of the tuning control signals" (24) is used to substantially maximize an average power delivered by the target port, at the carrier frequency of the excitation. This process is accurate, because it uses an extremum-seeking control algorithm, which is based on a closed-loop control scheme. This process quickly provides one or more subsequent tuning instructions such that this average power delivered by the target port takes on a value which is very near a maximum value, because this process is started not very far from this maximum value, thanks to the process "generating initial values of the tuning control signals" (23). In the previous sentence, "maximum value" means the greatest value, of said average power, which may be achieved by only adjusting the single-input-port and single-output-port tunable matching circuit.

The specialist in computation knows that "algorithms for minimization", also known as "minimization algorithms" are used for finding numerical approximations of the minima of a known function. For instance, some minimization algorithms are presented in the well-known book of R. P. Brent, entitled "Algorithms for minimization without derivatives", published by Prentice-Hall in 1973. More minimization algorithms are presented in the chapter 10 of the well-known book of W. H. Press, S. A. Teukolsky, W. T. Vetterling and B. P. Flannery, entitled "Numerical Recipes in Fortran 77—The art of Scientific Computing", Second Edition, Published by Cambridge University Press in 1992. Likewise, the specialist in computation knows that "algorithms for maximization", also known as "maximization algorithms" are used for finding numerical approximations of the maxima of a known function. Consequently, the specialist sees fundamental differences between a minimization algorithm or a maximization algorithm, on the one part, and the extremum-seeking control algorithm used in the invention, on the other part: a minimization algorithm or a maximization algorithm autonomously finds an extremum of a known function, without real-time constraint, whereas, as explained above, the extremum-seeking control algorithm autonomously finds, in real-time, a maximum or a minimum of the performance variable, without knowing an exact model of the controlled system (non-model-based optimization approach).

In contrast to the process "generating initial values of the tuning control signals" (23), the process "generating subsequent values of the tuning control signals" (24) is non-model-based and it uses a closed-loop control scheme.

Based on the explanations provided above, the specialist understands that the process "generating initial values of the tuning control signals" (23) and the process "generating subsequent values of the tuning control signals" (24) are such that the automatic tuning system optimally, quickly and automatically adjusts its single-input-port and single-output-port tunable matching circuit, without very difficult computations, in spite of the presence of losses in this single-input-port and single-output-port tunable matching circuit.

Second Embodiment

The second embodiment of a device of the invention, given by way of non-limiting example, also corresponds to the automatic tuning system shown in FIG. 2, and to the flowchart of a tuning sequence shown in FIG. 3. All explanations provided for the first embodiment are applicable to this second embodiment. Additionally, we have represented in FIG. 4 the single-input-port and single-output-port tunable matching circuit (4) used in this second embodiment. This single-input-port and single-output-port tunable matching circuit comprises:
    an output port (401) having two terminals (4011) (4012), the output port being single-ended;
    an input port (402) having two terminals (4021) (4022), the input port being single-ended;
    a coil (405); and
    two adjustable impedance devices of the tunable matching circuit (403) (404), each presenting a negative reactance.

Figure 4:
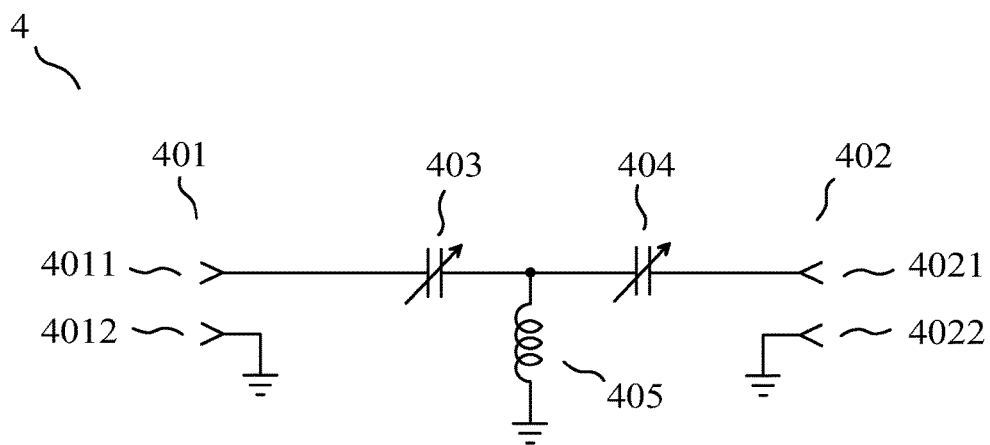
FIG. 4 shows a schematic diagram of a single-input-port and single-output-port tunable matching circuit (second embodiment)

All said adjustable impedance devices of the tunable matching circuit (403) (404) are adjustable by electrical means, but the circuits and the control links needed to adjust the reactance of each of the adjustable impedance devices of the tunable matching circuit are not shown in FIG. 4.

As shown in FIG. 2 and FIG. 4, the output port (401) is indirectly coupled to the target port (6) through the sensing unit (1), and the input port (402) is directly coupled to the user port (5). Thus, at said given frequency, the impedance presented by the input port is equal to the impedance presented by the user port. The sensing unit is such that, at said given frequency, the impedance seen by the output port is close to the impedance seen by the target port. The specialist understands that, at a frequency at which the single-input-port and single-output-port tunable matching circuit is intended to operate, the reactance of any one of the adjustable impedance devices of the tunable matching circuit has an influence on the impedance presented by the user port. More precisely, the reactance of any one of the adjustable impedance devices of the tunable matching circuit has, at said given frequency, if the impedance seen by the target port is equal to a given impedance, an influence on the impedance presented by the user port.

In this second embodiment, two adjustable impedance devices of the tunable matching circuit are used. Thus, it is possible that the number of adjustable impedance devices of the tunable matching circuit is greater than or equal to 2. As explained in the article of F. Broydé and E. Clavelier entitled "Some Properties of Multiple-Antenna-Port and Multiple-User-Port Antenna Tuners", published in *IEEE Trans. on Circuits and Systems—I: Regular Papers*, Vol. 62, No. 2, pp. 423-432, in February 2015, this is necessary to obtain a full tuning capability.

In this second embodiment, the tuning control unit delivers two tuning control signals to the single-input-port and single-output-port tunable matching circuit, and the reactance of each of the adjustable impedance devices of the tunable matching circuit is mainly determined by one and only one of the tuning control signals.

In this second embodiment, the excitation comprises a sinusoidal signal whose frequency is the carrier frequency of the excitation. The carrier frequency of the excitation may take on any value in a set of the possible values of the carrier frequency of the excitation.

The excitation being not amplitude modulated, the excitation alone does not cause variations, as a function of time, of the absolute value of a complex voltage across the target port, of the absolute value of a complex current flowing out of the target port, of the absolute value of a complex incident voltage at the target port, of an average power delivered by the target port, etc. The specialist understands that, consequently:
    the performance variable may for instance be substantially the output of a passive peak detector providing a positive voltage which is an increasing function of the absolute value of the complex voltage across the target port, a maximization of this performance variable maximizing an average power delivered by the target port;
    the performance variable may for instance be substantially the product of a positive constant and an average of the square of the instantaneous current flowing out of the target port, estimated by utilizing one or more of the sensing unit output signals, a maximization of this performance variable maximizing an average power delivered by the target port;

the performance variable may for instance be substantially the product of a positive constant and the square of an average of the absolute value of the instantaneous voltage across the target port, a maximization of this performance variable maximizing an average power delivered by the target port;

the performance variable may for instance be substantially the product of a negative constant and an average of the absolute value of the instantaneous voltage across the target port, a minimization of this performance variable maximizing an average power delivered by the target port;

the performance variable may for instance be the product of a positive constant and the output of a low-pass filter receiving at its input the square of an instantaneous incident voltage at the target port, a maximization of this performance variable maximizing an average power delivered by the target port.

Thus, the performance variable may be such that the extremum-seeking control algorithm substantially maximizes an average power delivered by the target port while the excitation is applied to the user port.

The specialist notes that a possible performance variable is substantially the image, under a function, of the absolute value of a complex envelope of an electrical variable sensed at the target port, the function being differentiable and strictly monotone over the set of nonnegative real numbers. The specialist also notes that, if said output port of the external device, which is coupled to the user port and which applies the excitation to the user port, substantially behaves as a port of an active linear two-terminal circuit element, then maximizing an average power delivered by the target port is equivalent to maximizing a transducer power gain of the single-input-port and single-output-port tunable matching circuit.

Thus, the performance variable may be such that the extremum-seeking control algorithm seeks to maximize a transducer power gain of the single-input-port and single-output-port tunable matching circuit.

Third Embodiment

The third embodiment of a device of the invention, given by way of non-limiting example, also corresponds to the automatic tuning system shown in FIG. 2, to the flowchart of a tuning sequence shown in FIG. 3 and to the single-input-port and single-output-port tunable matching circuit shown in FIG. 4. All explanations provided for the first embodiment and the second embodiment are applicable to this third embodiment.

Figure 5:
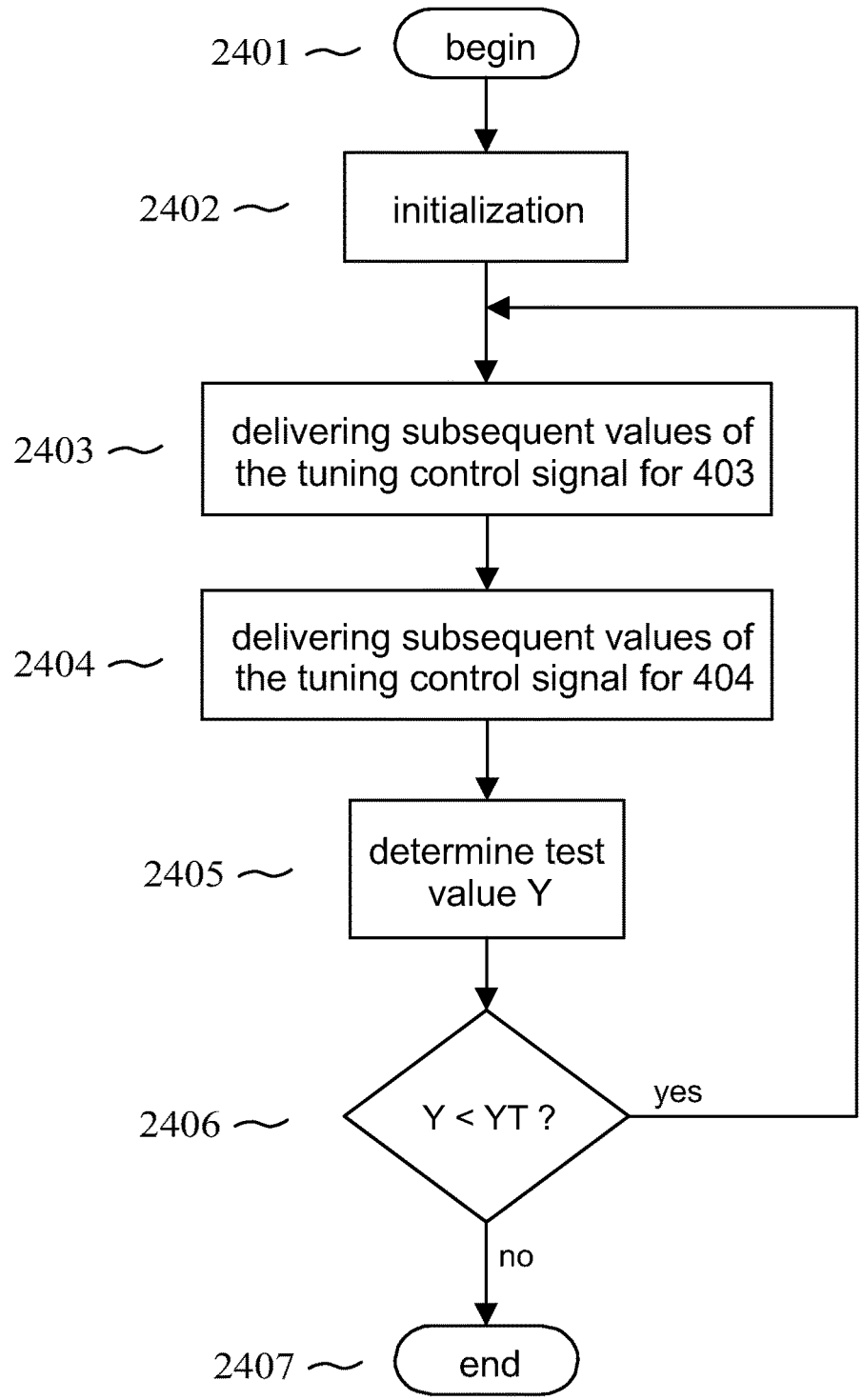
FIG. 5 shows a flowchart implemented in an automatic tuning system of the invention (third embodiment)

We have represented in FIG. 5 a flowchart applicable, in this third embodiment, to the process "generating subsequent values of the tuning control signals" (24) of FIG. 3. In addition to the begin symbol (2401) and the end symbol (2407), this flowchart comprises:

a process "initialization" (2402), in which a requirement is defined;

a process "delivering subsequent values of the tuning control signal for 403" (2403), in which at least one subsequent value of the tuning control signal which mainly determines the reactance of a first one of the adjustable impedance devices of the tunable matching circuit (403) is delivered using a single-parameter extremum-seeking control algorithm, the single-parameter extremum-seeking control algorithm seeking to maximize the performance variable by controlling said tuning control signal which mainly determines the reactance of a first one of the adjustable impedance devices of the tunable matching circuit (403);

a process "delivering subsequent values of the tuning control signal for 404" (2404), in which at least one subsequent value of the tuning control signal which mainly determines the reactance of a second one of the adjustable impedance devices of the tunable matching circuit (404) is delivered using a single-parameter extremum-seeking control algorithm, the single-parameter extremum-seeking control algorithm seeking to maximize the performance variable by controlling said tuning control signal which mainly determines the reactance of a second one of the adjustable impedance devices of the tunable matching circuit (404);

a process (2405) in which a test value is determined;

a decision (2406) used to reach the end symbol (2407) if the test value satisfies the requirement (which corresponds to the above-mentioned termination criterion).

The specialist understands that, in this third embodiment, at least one subsequent value of each of the tuning control signals is generated using a 2-parameter extremum-seeking control algorithm, the 2-parameter extremum-seeking control algorithm using a single-parameter aextremum-seeking control algorithm in the process "delivering subsequent values of the tuning control signal for 403" (2403), and a single-parameter extremum-seeking control algorithm in the process "delivering subsequent values of the tuning control signal for 404" (2404). Here, "single-parameter extremum-seeking control algorithm" refers to an extremum-seeking control algorithm which controls and varies 1 tuning control signal over time, and "2-parameter extremum-seeking control algorithm" refers to an extremum-seeking control algorithm which controls and varies 2 tuning control signals over time.

More generally, if p is an integer greater than or equal to 2, let "p-parameter extremum-seeking control algorithm" refer to an extremum-seeking control algorithm which controls and varies p tuning control signals over time. In a different embodiment such that the single-input-port and single-output-port tunable matching circuit hasp adjustable impedance devices of the tunable matching circuit, such that the tuning control unit delivers p tuning control signals, and such that the reactance of each of the adjustable impedance devices of the tunable matching circuit is mainly determined by one and only one of the tuning control signals, it is possible that at least one subsequent value of each of the tuning control signals is generated using a p-parameter extremum-seeking control algorithm, which uses a plurality of extremum-seeking control algorithms each of which controls and varies less than p tuning control signals over time, for instance p single-parameter extremum-seeking control algorithms.

Fourth Embodiment

The fourth embodiment of a device of the invention, given by way of non-limiting example, also corresponds to the automatic tuning system shown in FIG. 2, to the flowchart of a tuning sequence shown in FIG. 3, to the single-input-port and single-output-port tunable matching circuit shown in FIG. 4, and to the flowchart of the process "generating subsequent values of the tuning control signals" shown in FIG. 5. All explanations provided for the first embodiment, the second embodiment and the third embodiment are applicable to this fourth embodiment.

We have represented in FIG. 6 a flowchart which is applicable, in this fourth embodiment, to the process "delivering subsequent values of the tuning control signal for 403" (2403) of FIG. 5, and to the process "delivering subsequent values of the tuning control signal for 404" (2404) of FIG. 5. In addition to the begin symbol (2701) and the end symbol (2706), this flowchart comprises:
- a process (2702) in which a timer is set to zero and started;
- a process (2703) in which a single-parameter extremum-seeking control algorithm, which delivers subsequent values of one of the tuning control signals, is started;
- a decision (2704) used to wait for a predefined period;
- a process (2705) in which the single-parameter extremum-seeking control algorithm is stopped.

For instance, a suitable single-parameter extremum-seeking control algorithm may be a perturbation based extremum-seeking control algorithm, which comprises a step in which a periodical perturbation is applied to said one of the tuning control signals. For instance, this approach is discussed in chapter 1 of said book of K. B. Ariyur and M. Krstic, in the case of a purely analog implementation.

Fifth Embodiment

The fifth embodiment of a device of the invention, given by way of non-limiting example, also corresponds to the automatic tuning system shown in FIG. 2, to the flowchart of a tuning sequence shown in FIG. 3, to the single-input-port and single-output-port tunable matching circuit shown in FIG. 4, and to the flowchart of the process "generating subsequent values of the tuning control signals" shown in FIG. 5. All explanations provided for the first embodiment, the second embodiment and the third embodiment are applicable to this fifth embodiment.

We have represented in FIG. 7 a flowchart which is applicable, in this fifth embodiment, to the process "delivering subsequent values of the tuning control signal for 403" (2403) of FIG. 5, and to the process "delivering subsequent values of the tuning control signal for 404" (2404) of FIG. 5. In addition to the begin symbol (2701) and the end symbol (2706), this flowchart comprises:
- a process (2707) in which a requirement is defined;
- a process (2708) in which one stage of a single-parameter extremum-seeking control algorithm is performed, during which a predefined number of subsequent values of one of the tuning control signals are delivered;
- a process (2709) in which a test value is determined;
- a decision (2710) used to reach the end symbol (2706) if the test value satisfies the requirement.

For instance, a suitable single-parameter extremum-seeking control algorithm may be a stochastic extremum-seeking control algorithm, which comprises a step in which a stochastic or random perturbation, for instance a colored noise passed through a bounded nonlinearity, is applied to said one of the tuning control signals. For instance, this approach is discussed in chapter 5 of said book of S.-J. Liu and M. Krstic, in the case of a purely analog implementation.

Sixth Embodiment

The sixth embodiment of a device of the invention, given by way of non-limiting example, also corresponds to the automatic tuning system shown in FIG. 2, to the flowchart of a tuning sequence shown in FIG. 3, and to the single-input-port and single-output-port tunable matching circuit shown in FIG. 4. All explanations provided for the first embodiment and the second embodiment are applicable to this sixth embodiment.

Figure 8:
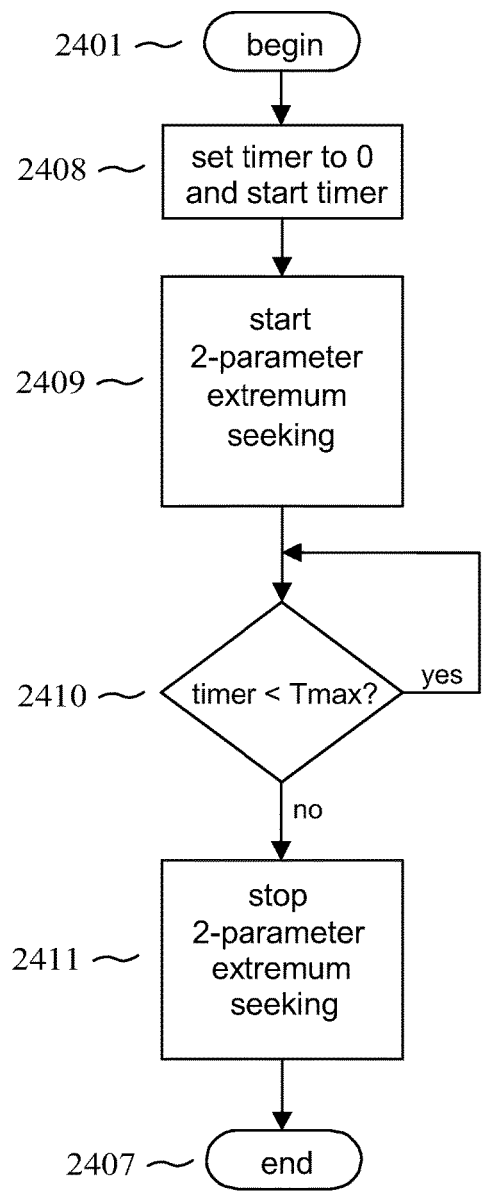
FIG. 8 shows a flowchart implemented in an automatic tuning system of the invention (sixth embodiment)

We have represented in FIG. 8 a flowchart applicable, in this sixth embodiment, to the process "generating subsequent values of the tuning control signals" (24) of FIG. 3. In addition to the begin symbol (2401) and the end symbol (2407), this flowchart comprises:
- a process (2408) in which a timer is set to zero and started;
- a process (2409) in which a 2-parameter extremum-seeking control algorithm, which delivers subsequent values of both tuning control signals, is started;
- a decision (2410) used to wait for a predefined period;
- a process (2411) in which the 2-parameter extremum-seeking control algorithm is stopped.

For instance, a suitable 2-parameter extremum-seeking control algorithm may be a perturbation based extremum-seeking control algorithm, which comprises a step in which two different periodical perturbations are each applied to one of the tuning control signals. For instance, this approach is discussed in chapter 2 of said book of K. B. Ariyur and M. Krstic, in the case of a purely analog implementation. It offers higher performance than the one used in the fourth embodiment.

More generally, p being an integer greater than or equal to 2, in a different embodiment such that the single-input-port and single-output-port tunable matching circuit has p adjustable impedance devices of the tunable matching circuit, such that the tuning control unit delivers p tuning control signals, and such that the reactance of each of the adjustable impedance devices of the tunable matching circuit is mainly determined by one and only one of the tuning control signals, it is possible that at least one subsequent value of each of the tuning control signals is generated using a p-parameter extremum-seeking control algorithm which is a perturbation based extremum-seeking control algorithm, which comprises a step in which p different periodical perturbations are each applied to one of the tuning control signals.

Seventh Embodiment

The seventh embodiment of a device of the invention, given by way of non-limiting example, also corresponds to the automatic tuning system shown in FIG. 2, to the flowchart of a tuning sequence shown in FIG. 3, and to the single-input-port and single-output-port tunable matching circuit shown in FIG. 4. All explanations provided for the first embodiment and the second embodiment are applicable to this seventh embodiment.

Figure 9:
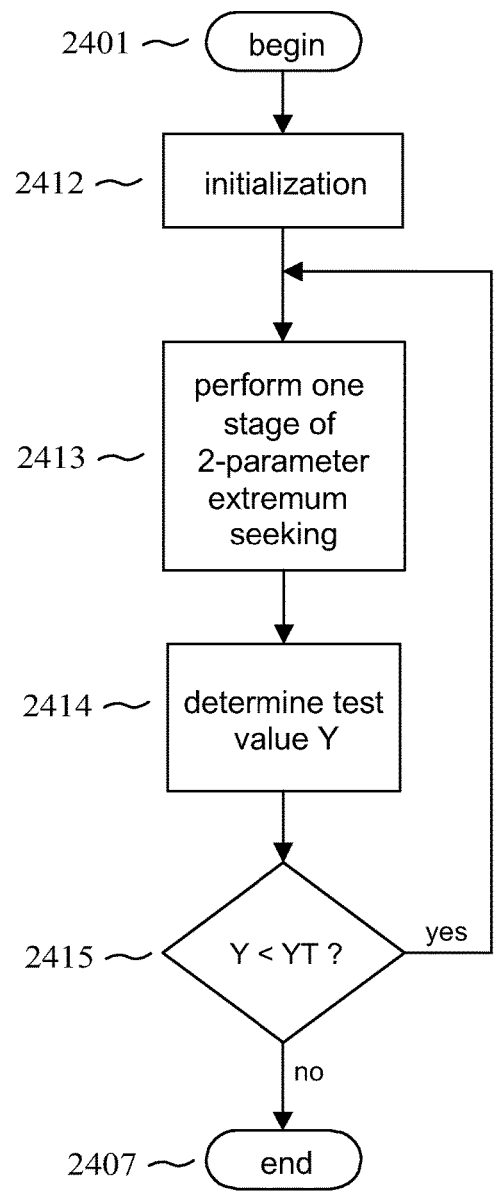
FIG. 9 shows a flowchart implemented in an automatic tuning system of the invention (seventh embodiment)

We have represented in FIG. 9 a flowchart applicable, in this seventh embodiment, to the process "generating subsequent values of the tuning control signals" (24) of FIG. 3. In addition to the begin symbol (2401) and the end symbol (2407), this flowchart comprises:
- a process (2412) in which a requirement is defined;
- a process (2413) in which one stage of a 2-parameter extremum-seeking control algorithm is performed, during which a predefined number of subsequent values of both tuning control signals are delivered;
- a process (2414) in which a test value is determined;
- a decision (2415) used to reach the end symbol (2407) if the test value satisfies the requirement (which corresponds to the above-mentioned termination criterion).

For instance, a suitable 2-parameter extremum-seeking control algorithm may be a stochastic extremum-seeking control algorithm, which comprises a step in which two different stochastic or random perturbations are each applied to one of the tuning control signals. For instance, this approach is discussed in chapter 8 of said book of S.-J. Liu and M. Krstic, in the case of a purely analog implementation. It offers higher performance than the one used in the fifth embodiment.

More generally, p being an integer greater than or equal to 2, in a different embodiment such that the single-input-port and single-output-port tunable matching circuit has p adjustable impedance devices of the tunable matching circuit, such that the tuning control unit delivers p tuning control signals, and such that the reactance of each of the adjustable impedance devices of the tunable matching circuit is mainly determined by one and only one of the tuning control signals, it is possible that at least one subsequent value of each of the tuning control signals is generated using a p-parameter extremum-seeking control algorithm which is a stochastic extremum-seeking control algorithm, which comprises a step in which p different stochastic or random perturbations are each applied to one of the tuning control signals.

Eighth Embodiment (Best Mode)

Figure 10:
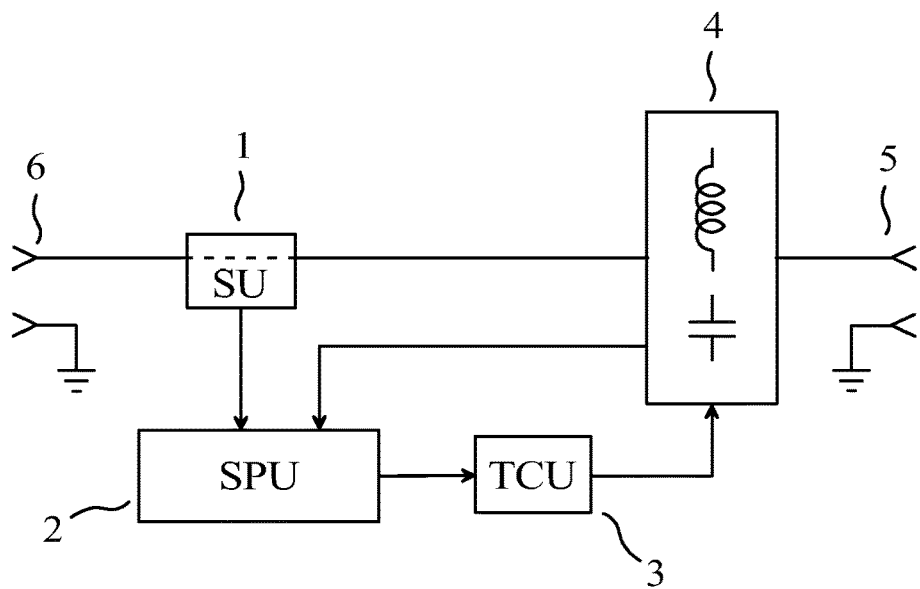
FIG. 10 shows the block diagram of an automatic tuning system of the invention (eighth embodiment)

As an eighth embodiment of a device of the invention, given by way of non-limiting example and best mode of carrying out the invention, we have represented in FIG. 10 the block diagram of an automatic tuning system having a user port (5) and a target port (6), the automatic tuning system allowing, at a given frequency greater than or equal to 300 MHz, a transfer of power from the user port to the target port, the automatic tuning system comprising:
  a sensing unit (1), the sensing unit delivering two or more "sensing unit output signals", each of the sensing unit output signals being mainly determined by an electrical variable sensed at the target port while an excitation is applied to the user port;
  a single-input-port and single-output-port tunable matching circuit (4), the single-input-port and single-output-port tunable matching circuit comprising one or more adjustable impedance devices, the one or more adjustable impedance devices being referred to as "the adjustable impedance devices of the tunable matching circuit" and being such that, at said given frequency, each of the adjustable impedance devices of the tunable matching circuit has a reactance, the reactance of any one of the adjustable impedance devices of the tunable matching circuit being adjustable by electrical means, the single-input-port and single-output-port tunable matching circuit comprising a temperature measurement device which measures, at one or more locations in the single-input-port and single-output-port tunable matching circuit, a temperature, to obtain one or more "temperature signals", each of the one or more temperature signals being mainly determined by one or more of the temperatures at said one or more locations;
  a signal processing unit (2), the signal processing unit delivering "tuning instructions", at least one of the tuning instructions being an "initial tuning instruction", each of the one or more initial tuning instructions being determined as a function of said one or more temperature signals and as a function of two or more real quantities depending on an impedance seen by the target port, said two or more real quantities depending on an impedance seen by the target port being estimated as a function of two or more of the sensing unit output signals, at least one of the tuning instructions being a "subsequent tuning instruction", each of the one or more subsequent tuning instructions being determined by utilizing an extremum-seeking control algorithm, the extremum-seeking control algorithm seeking to maximize or to minimize a performance variable, the performance variable being estimated as a function of one or more of the sensing unit output signals; and
  a tuning control unit (3), the tuning control unit receiving the tuning instructions from the signal processing unit, the tuning control unit delivering one or more "tuning control signals" to the single-input-port and single-output-port tunable matching circuit, the tuning control unit generating, for each of the one or more tuning control signals, one or more values of said each of the one or more tuning control signals, each of said one or more values of said each of the one or more tuning control signals being determined as a function of one of the tuning instructions, the reactance of each of the adjustable impedance devices of the tunable matching circuit being mainly determined by at least one of the one or more tuning control signals.

The two or more real quantities depending on an impedance seen by the target port are such that they are sufficient for being able to compute the impedance seen by the target port.

A bandpass signal is sometimes improperly referred to as "passband signal" or "narrow-band signal" (in French: "signal à bande étroite"). A bandpass signal is any real signal s(t), where t denotes the time, such that the spectrum of s(t) is included in a frequency interval $[f_C-W/2, f_C+W/2]$, where $f_C$ is a frequency referred to as "carrier frequency" and where W is a frequency referred to as "bandwidth", which satisfies $W<2f_C$. Thus, the Fourier transform of s(t), denoted by S(f), is non-negligible only in the frequency intervals $[-f_C-W/2, -f_C+W/2]$ and $[f_C-W/2, f_C+W/2]$. The complex envelope of the real signal s(t), also referred to as "complex baseband equivalent" or "baseband-equivalent signal", is a complex signal $s_B(t)$ whose Fourier transform $S_B(f)$ is non-negligible only in the frequency interval $[-W/2, W/2]$ and satisfies $S_B(f)=k\,S(f_C+f)$ in this interval, where k is a real constant which is chosen equal to the square root of 2 by some authors. The real part of $s_B(t)$ is referred to as the in-phase component, and the imaginary part of $s_B(t)$ is referred to as the quadrature component.

The frequency interval $[f_C-W/2, f_C+W/2]$ is a passband of the bandpass signal. From the definitions, it is clear that, for a given bandpass signal, several choices of carrier frequency $f_C$ and of bandwidth W are possible, so that the passband of the bandpass signal is not uniquely defined. However, any passband of the bandpass signal must contain any frequency at which the spectrum of s(t) is not negligible. The complex envelope of a bandpass signal s(t) clearly depends on the choice of a carrier frequency among the possible ones. However, for a given choice of the real constant k, we can say that: the absolute value of the complex envelope of the bandpass signal does not depend on the choice of the carrier frequency; and, for a given choice of the carrier frequency, the complex envelope of the bandpass signal is uniquely defined. Conversely, we can say that the carrier frequency of a bandpass signal s(t) depends on the choice of a complex envelope among the possible ones. However, for a given complex envelope, the carrier frequency of the bandpass signal is uniquely defined.

An external device has an output port, the output port of the external device being coupled to the user port. The external device is not shown in FIG. 10. The excitation is produced by the external device, from a modulating signal $s_M(t)$, which can be a real signal or a complex signal. The external device applies the excitation to the user port. The external device also provides one or more other signals to the signal processing unit, and/or receives one or more other signals from the signal processing unit. The electrical links needed to carry such other signals are not shown in FIG. 10.

The excitation is a bandpass signal s(t), of carrier frequency $f_C$, whose complex envelope $s_B(t)$ is, for any fixed value of $Z_U$, substantially proportional to the modulating signal $s_M(t)$. The specialist knows that such an excitation may for instance be obtained:

as the result of a phase modulation and/or an amplitude modulation of a single carrier at the frequency $f_C$;

as a linear combination of a first signal and a second signal, the first signal being the product of the real part of the modulating signal and a first sinusoidal carrier of frequency $f_C$, the second signal being the product of the imaginary part of the modulating signal and a second sinusoidal carrier of frequency $f_C$, the second sinusoidal carrier being 90° out of phase with respect to the first sinusoidal carrier;

in other ways, for instance without using any carrier, for instance using directly a filtered output of a digital-to-analog converter.

If the absolute value of the modulating signal does not vary as a function of time, the excitation is not amplitude modulated, and the excitation alone does not cause variations, as a function of time, of the absolute value of a complex voltage across the target port, of the absolute value of a complex current flowing out of the target port, of the absolute value of a complex incident voltage at the target port, of an average power delivered by the target port, etc. The specialist understands that, in this case, each of the performance variables mentioned as examples in the second embodiment may, for instance, be used in this eighth embodiment.

If the absolute value of the modulating signal varies as a function of time, the excitation is amplitude modulated, and the excitation alone causes variations, as a function of time, of the absolute value of a complex voltage across the target port, of the absolute value of a complex current flowing out of the target port, of the absolute value of a complex incident voltage at the target port, of an average power delivered by the target port, etc. In this case, none of the performance variables mentioned as examples in the second embodiment is appropriate. However, the specialist understands that the excitation alone does not cause variations, as a function of time, of a performance variable which is inversely proportional to a suitable function of the absolute value of the modulating signal. Thus, the specialist understands that, in the case where the absolute value of the modulating signal varies as a function of time and is never zero (and also in the case where the absolute value of the modulating signal does not vary as a function of time):

the performance variable may for instance be substantially a product of three terms, this product being the product of a positive constant, an average of the square of the instantaneous current flowing out of the target port, and the inverse of the square of the absolute value of the modulating signal, a maximization of this performance variable maximizing an average power delivered by the target port;

the performance variable may for instance be substantially a product of three terms, this product being the product of a negative constant, an average of the absolute value of the instantaneous voltage across the target port, and the inverse of the absolute value of the modulating signal, a minimization of this performance variable maximizing an average power delivered by the target port;

the performance variable may for instance be substantially a product of three terms, this product being the product of a positive constant, the output of a first low-pass filter receiving at its input the square of an instantaneous incident voltage at the target port, and the inverse of the output of a second low-pass filter receiving at its input the square of the absolute value of the modulating signal, a maximization of this performance variable maximizing an average power delivered by the target port.

The specialist understands that an amplitude modulation of the excitation alone does not cause variations, as a function of time, of these performance variables, so that these performance variables are suitable in the case where the excitation is amplitude modulated. The specialist understands that, to obtain such a performance variable, the signal processing unit may for instance receive the modulating signal from the external device, as one of said one or more other signals, and estimate the performance variable as a function of one or more of the sensing unit output signals and as a function of the modulating signal. In particular, the performance variable may be such that, if the absolute value of the modulating signal is not substantially zero, then: the performance variable is inversely proportional to the image of an absolute value of the modulating signal under a function, the function being differentiable and strictly monotone over the set of nonnegative real numbers; and the performance variable is substantially proportional to the image, under the function, of an absolute value of a complex envelope of an electrical variable sensed at the target port. It may be shown that a suitable function $f$ may be such that the image of a positive real number x under the function is $f(x) = K x^k$, where k and K are nonzero real constants.

Thus, the performance variable may be such that the extremum-seeking control algorithm substantially maximizes an average power delivered by the target port while the excitation is applied to the user port.

The excitation being a bandpass signal, it is possible to show that, if the bandwidth of the excitation is sufficiently narrow, then any voltage or current measured at the target port and caused by the excitation is a bandpass signal a complex envelope of which is proportional to the complex envelope of the excitation, the coefficient of proportionality being complex and time-independent. Thus, we may consider that the excitation causes, at the target port: a current flowing out of the target port, of complex envelope $i_{TP}(t)$; and a voltage across the target port, of complex envelope $v_{TP}(t)$. If the bandwidth of the complex envelope of the excitation is sufficiently narrow, we have $$v_{TP}(t) = Z_{Sant} i_{TP}(t) \tag{1}$$

where $Z_{Sant}$ is the impedance seen by the target port, at the carrier frequency.

The two or more real quantities depending on an impedance seen by the target port may consist of a real number proportional to the absolute value of the admittance seen by the target port, and of a real number proportional to a phase of the admittance seen by the target port. The specialist understands how the signal processing unit can process the sensing unit output signals, to obtain a real number proportional to the absolute value of the admittance seen by the target port, and a real number proportional to a phase of the admittance seen by the target port. For instance, let us assume that the sensing unit delivers: a first sensing unit output signal proportional to the voltage across the target port; and a second sensing unit output signal proportional to the current flowing out of the target port. The signal processing unit may for instance perform a down-conversion of the sensing unit output signals, followed by an in-phase/quadrature (I/Q) demodulation (heterodyne reception), to obtain four analog signals, proportional to the real part of $v_{TP}(t)$, the imaginary part of $v_{TP}(t)$, the real part of $i_{TP}(t)$, and the imaginary part of $i_{TP}(t)$, respectively. These analog signals may then be converted into digital signals and further processed in the digital domain, based on equation (1), to estimate the absolute value of the admittance seen by the target port, and the phase of the admittance seen by the target port.

The excitation is applied continuously, so that the sensing unit can continuously deliver said sensing unit output signals each determined by an electrical variable sensed at the target port while an excitation is applied to the user port.

Figure 11:
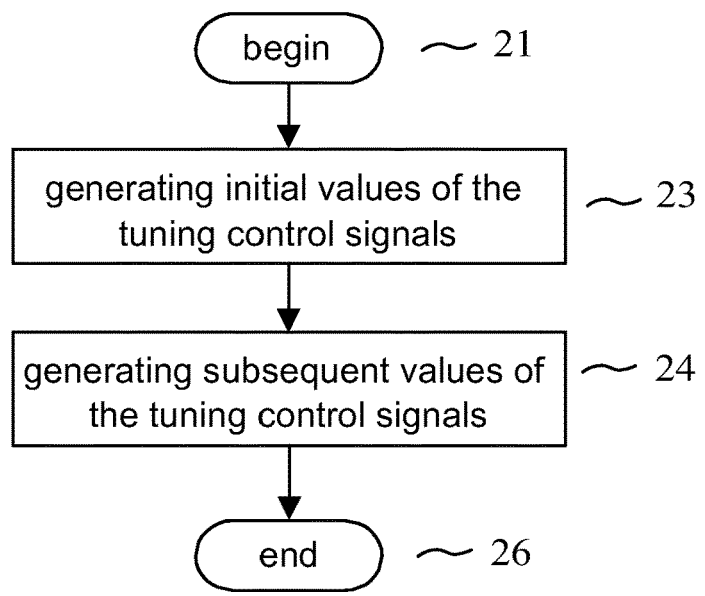
FIG. 11 shows a flowchart implemented in an automatic tuning system of the invention (eighth embodiment)

The tuning instructions may be of any type of digital message. In this eighth embodiment, the tuning instructions are delivered during one or more tuning sequences. A flowchart of one of the one or more tuning sequences is shown in FIG. 11. In addition to the begin symbol (21) and the end symbol (26), this flowchart comprises:

a process "generating initial values of the tuning control signals" (23), in which the signal processing unit delivers one said initial tuning instruction, and in which the tuning control unit generates, for each of the one or more tuning control signals, an initial value determined as a function of said one said initial tuning instruction;

a process "generating subsequent values of the tuning control signals" (24), in which the signal processing unit delivers two or more said subsequent tuning instructions, and in which the tuning control unit generates, for each of the one or more tuning control signals, two or more subsequent values each determined as a function of one of said two or more said subsequent tuning instructions.

The process "generating initial values of the tuning control signals" (23) uses an open-loop control scheme, in which said one or more temperature signals, said two or more real quantities depending on an impedance seen by the target port and a quantity depending on the carrier frequency of the excitation are used to obtain, for each of the one or more tuning control signals, an initial value (of course, this initial value has no influence on the impedance seen by the target port). In this process, the signal processing unit receives said one or more temperature signals provided by the single-input-port and single-output-port tunable matching circuit, as shown in FIG. 10. The signal processing unit also receives the value of the carrier frequency $f_C$, this value being carried by said one or more other signals.

According to a first example of the process "generating initial values of the tuning control signals" (23), said one said initial tuning instruction is determined based on a model of the single-input-port and single-output-port tunable matching circuit, this model taking into account the influences of the carrier frequency $f_C$, of the two or more real quantities depending on an impedance seen by the target port, of an initial tuning instruction and of the temperatures at said one or more locations, on a transducer power gain of the single-input-port and single-output-port tunable matching circuit. The specialist understands that this model may for instance comprise: for each of the adjustable impedance devices of the tunable matching circuit, a lookup table about the characteristics of said each of the adjustable impedance devices of the tunable matching circuit; and one or more formulas for computing the transducer power gain. The signal processing unit estimates the two or more real quantities depending on an impedance seen by the target port, and uses an "open-loop algorithm" to determine said one said initial tuning instruction, said one said initial tuning instruction being such that a predicted value of the transducer power gain of the single-input-port and single-output-port tunable matching circuit, determined based on the model, is as high as possible, at the carrier frequency $f_C$. This process requires neither difficult computations nor a long time, because the open-loop algorithm directly uses the value of the carrier frequency $f_C$, the two or more real quantities depending on an impedance seen by the target port, and the temperatures at said one or more locations, to determine said one said initial tuning instruction. This process quickly provides said one said initial tuning instruction, which is such that the transducer power gain is typically closer to a maximum transducer power gain achievable with the single-input-port and single-output-port tunable matching circuit, at the carrier frequency $f_C$, than the transducer power gain obtained in the corresponding process of the first embodiment, because the model of the single-input-port and single-output-port tunable matching circuit used in this eighth embodiment takes into account the influences of the temperatures at said one or more locations.

According to a second example of the process "generating initial values of the tuning control signals" (23), said one said initial tuning instruction is determined based on a model of the single-input-port and single-output-port tunable matching circuit, this model taking into account the influences of the carrier frequency of the excitation, of the two or more real quantities depending on an impedance seen by the target port, of an initial tuning instruction and of the temperatures at said one or more locations, on the impedance presented by the user port $Z_U$. The specialist understands that this model may for instance comprise: for each of the adjustable impedance devices of the tunable matching circuit, a lookup table about the characteristics of said each of the adjustable impedance devices of the tunable matching circuit; and one or more formulas for computing the impedance presented by the user port. The signal processing unit uses an "open-loop algorithm" to determine said one said initial tuning instruction, said one said initial tuning instruction being such that a predicted absolute value of the difference between the impedance presented by the user port and a wanted impedance, determined based on the model, is as small as possible, at the carrier frequency of the excitation. This process quickly provides said one said initial tuning instruction, which is such that the impedance presented by the user port is typically closer to the wanted impedance, at the carrier frequency of the excitation, than the impedance presented by the user port obtained in the corresponding process of the first embodiment, because the model of the single-input-port and single-output-port tunable matching circuit used in this eighth embodiment takes into account the influences of the temperatures at said one or more locations.

As in the first embodiment, the process "generating subsequent values of the tuning control signals" (24) uses a closed-loop control scheme and an extremum-seeking control algorithm, and it can substantially maximize an average power delivered by the target port, at the carrier frequency $f_C$. This process is however typically faster, for a given accuracy, than the corresponding process of the first embodiment, because the process "generating initial values of the tuning control signals" (23) is typically more accurate, since it takes into account the influences of the temperatures at said one or more locations.

The duration of a tuning sequence is less than 10 µs. A new tuning sequence starts shortly after each change of the value of the carrier frequency $f_C$, and no later than 10 milliseconds after the beginning of the previous tuning sequence. For each of the one or more tuning control signals, the last subsequent value generated during a tuning sequence remains applicable until the initial value of the next tuning sequence is generated. Thus, the automatic tuning system optimally, quickly and automatically adjusts its single-input-port and single-output-port tunable matching circuit, without very difficult computations, in spite of the presence of losses in this single-input-port and single-output-port tunable matching circuit.

The signal processing unit may also estimate one or more quantities each depending on the power delivered by the target port. For instance, such quantities each depending on the power delivered by the target port may be used to control the power delivered by the target port, by varying the power delivered to the user port.

The characteristics of the single-input-port and single-output-port tunable matching circuit are such that the automatic tuning system allows, at said given frequency, a low-loss transfer of power from the user port to the target port, and a low-loss transfer of power from the target port to the user port.

Ninth Embodiment

The ninth embodiment of a device of the invention, given by way of non-limiting example, also corresponds to the automatic tuning system shown in FIG. 10, and all explanations provided for the eighth embodiment are applicable to this ninth embodiment. Additionally, we have represented in FIG. 12 the single-input-port and single-output-port tunable matching circuit (4) used in this ninth embodiment. This single-input-port and single-output-port tunable matching circuit comprises:
- an output port (401) having two terminals (4011) (4012), the output port being single-ended;
- an input port (402) having two terminals (4021) (4022), the input port being single-ended;
- a coil (405);
- two adjustable impedance devices of the tunable matching circuit (403) (404), each presenting a negative reactance;
- a temperature measurement device (45) comprising two temperature sensors (451) (452), the temperature measurement device measuring, at the location of each of the temperature sensors, a temperature, to obtain one or more temperature signals, each of the one or more temperature signals being mainly determined by the temperature at the location of one of the temperature sensors;
- an electromagnetic screen (48), which is grounded.

Figure 12:
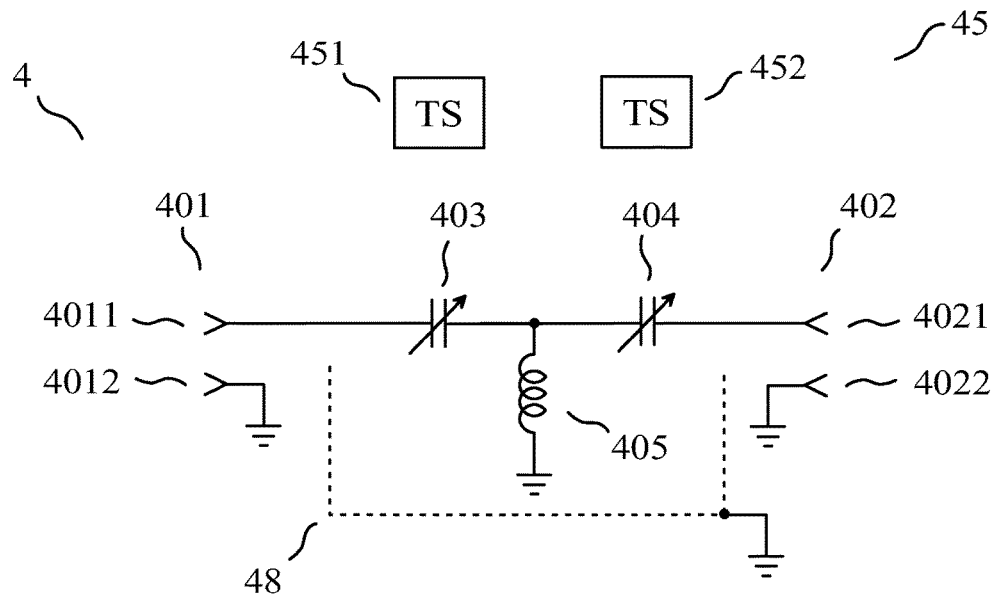
FIG. 12 shows a schematic diagram of a single-input-port and single-output-port tunable matching circuit, which may be used in the automatic tuning system shown in FIG. 10 (ninth embodiment)

All said adjustable impedance devices of the tunable matching circuit (403) (404) are adjustable by electrical means, but the circuits and the control links needed to adjust the reactance of each of the adjustable impedance devices of the tunable matching circuit are not shown in FIG. 12. The links needed to power feed the temperature sensors (451) (452) and to carry said one or more temperature signals are not shown in FIG. 12.

As shown in FIG. 10 and FIG. 12, the output port (401) is indirectly coupled to the target port (6) through the sensing unit (1), and the input port (402) is directly coupled to the user port (5). Thus, at said given frequency, the impedance presented by the input port is equal to the impedance presented by the user port. The sensing unit is such that, at said given frequency, the impedance seen by the output port is close to the impedance seen by the target port. The specialist understands that, at a frequency at which the single-input-port and single-output-port tunable matching circuit is intended to operate, the reactance of any one of the adjustable impedance devices of the tunable matching circuit has an influence on the impedance presented by the user port.

Experimental results have shown that the electromagnetic characteristics of the volume surrounding the single-input-port and single-output-port tunable matching circuit often influence $Z_U$. The specialist understands that this phenomenon may be detrimental, because the process "generating initial values of the tuning control signals" (23) uses an open-loop control scheme. Experimental results have shown that this phenomenon may be mitigated by reducing the variable electromagnetic field produced by the single-input-port and single-output-port tunable matching circuit outside the single-input-port and single-output-port tunable matching circuit. In FIG. 12, an appropriate reduction of this electromagnetic field is provided by the electromagnetic screen (48), which may also be referred to as electromagnetic shield, and which is connected to a ground plane of the printed circuit board on which the single-input-port and single-output-port tunable matching circuit is built.

A first one of the temperature sensors (451) is located near a first one of the adjustable impedance devices of the tunable matching circuit (403), in such a way that it measures a temperature which is close to the temperature of said first one of the adjustable impedance devices of the tunable matching circuit. A second one of the temperature sensors (452) is located near a second one of the adjustable impedance devices of the tunable matching circuit (404), in such a way that it measures a temperature which is close to the temperature of said second one of the adjustable impedance devices of the tunable matching circuit. In this manner, the one or more temperature signals provide information on the temperatures of each of the adjustable impedance devices of the tunable matching circuit, which may be different from one another. The specialist understands that these temperatures may in particular be different if a significant high-frequency power is transferred from the user port to the target port, because the powers dissipated in the adjustable impedance devices of the tunable matching circuit are typically different from one another.

In this ninth embodiment, two temperature sensors are used, to measure, at two locations in the single-input-port and single-output-port tunable matching circuit, a temperature. Thus, it is possible that the number of locations in the single-input-port and single-output-port tunable matching circuit, at which a temperature is measured, is greater than or equal to 2.

Tenth Embodiment

The tenth embodiment of a device of the invention, given by way of non-limiting example, also corresponds to the automatic tuning system shown in FIG. 10, and all explanations provided for the eighth embodiment are applicable to this tenth embodiment. Additionally, we have represented in FIG. 13 the single-input-port and single-output-port tunable matching circuit (4) used in this tenth embodiment. This single-input-port and single-output-port tunable matching circuit comprises:
- an output port (401) having two terminals (4011) (4012), the output port being single-ended;
- an input port (402) having two terminals (4021) (4022), the input port being single-ended;
- one adjustable impedance device of the tunable matching circuit (406), presenting a positive reactance;
- two adjustable impedance devices of the tunable matching circuit (407) (408), each presenting a negative reactance;
- a temperature measurement device (45) comprising a single temperature sensor (453), the temperature measurement device measuring, at the location of the temperature sensor, a temperature, to obtain one or more temperature signals, each of the one or more temperature signals being mainly determined by the temperature at the location of the temperature sensor;
- an electromagnetic screen (48), which is grounded.

Figure 13:
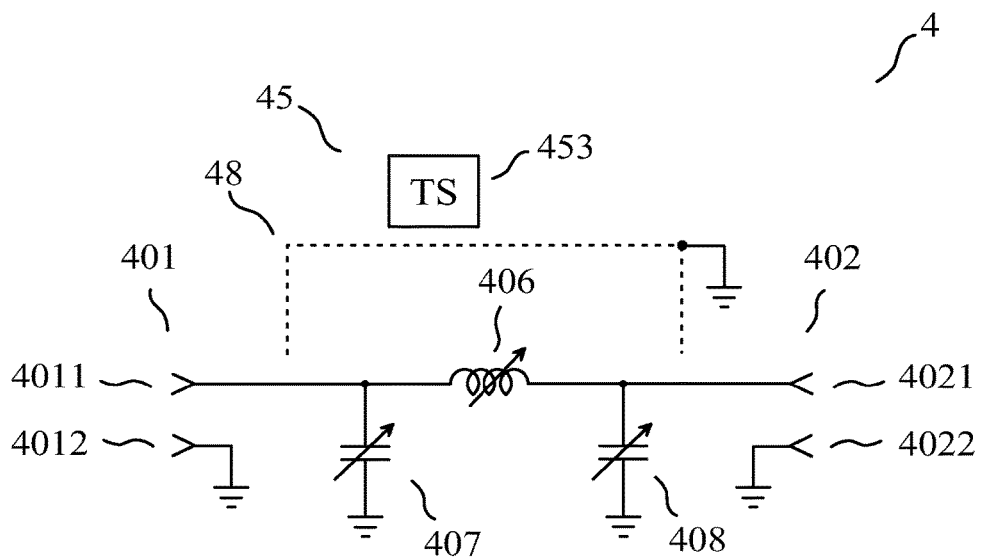
FIG. 13 shows a schematic diagram of a single-input-port and single-output-port tunable matching circuit, which may be used in the automatic tuning system shown in FIG. 10 (tenth embodiment)

All said adjustable impedance devices of the tunable matching circuit (406) (407) (408) are adjustable by electrical means, but the circuits and the control links needed to adjust the reactance of each of the adjustable impedance devices of the tunable matching circuit are not shown in FIG. 13. The links needed to power feed the temperature sensor (453) and to carry said one or more temperature signals are not shown in FIG. 13.

In this tenth embodiment, the electromagnetic screen (48) forms an enclosure containing all said adjustable impedance devices of the tunable matching circuit (406) (407) (408), in which the temperature is almost uniform. This is why a single temperature sensor is used.

In this tenth embodiment, three adjustable impedance devices of the tunable matching circuit are used. Thus, it is possible that the number of adjustable impedance devices of the tunable matching circuit is greater than or equal to 3.

In the second, ninth and tenth embodiments, the output port and the input port of the single-input-port and single-output-port tunable matching circuit are single-ended ports. This is not at all a characteristic of the invention. In general, it is possible that the input port of the single-input-port and single-output-port tunable matching circuit is a symmetrical (i.e., balanced) port, and it is possible that the output port of the single-input-port and single-output-port tunable matching circuit is a symmetrical port.

Eleventh Embodiment

Figure 14:
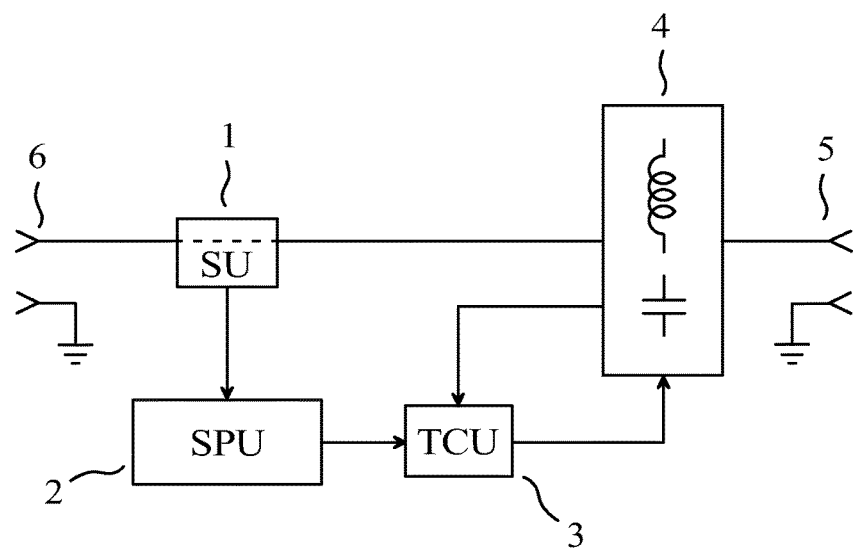
FIG. 14 shows the block diagram of an automatic tuning system of the invention (eleventh embodiment)

As an eleventh embodiment of a device of the invention, given by way of non-limiting example, we have represented in FIG. 14 the block diagram of an automatic tuning system having one user port (5) and one target port (6), the automatic tuning system allowing, at a given frequency greater than or equal to 30 MHz, a transfer of power from the user port to the target port, the automatic tuning system comprising:
- a sensing unit (1), the sensing unit delivering two or more "sensing unit output signals", each of the sensing unit output signals being determined by an electrical variable sensed at the target port while an excitation is applied to the user port;
- a single-input-port and single-output-port tunable matching circuit (4), the single-input-port and single-output-port tunable matching circuit comprising one or more adjustable impedance devices, the one or more adjustable impedance devices being referred to as "the adjustable impedance devices of the tunable matching circuit" and being such that, at said given frequency, each of the adjustable impedance devices of the tunable matching circuit has a reactance, the reactance of any one of the adjustable impedance devices of the tunable matching circuit being adjustable by electrical means, the single-input-port and single-output-port tunable matching circuit comprising a temperature measurement device which measures, at one or more locations in the single-input-port and single-output-port tunable matching circuit, a temperature, to obtain one or more "temperature signals", each of the one or more temperature signals being determined by one or more of the temperatures at said one or more locations;
- a signal processing unit (2) similar to the one described in the first embodiment; and
- a tuning control unit (3), the tuning control unit receiving the tuning instructions from the signal processing unit, the tuning control unit delivering one or more "tuning control signals" to the single-input-port and single-output-port tunable matching circuit, the tuning control unit generating, for each of the one or more tuning control signals, one or more values of said each of the one or more tuning control signals, each of said one or more values of said each of the one or more tuning control signals being determined as a function of said one or more temperature signals and as a function of at least one of the tuning instructions, the reactance of each of the adjustable impedance devices of the tunable matching circuit being mainly determined by one or more values of at least one of the one or more tuning control signals.

An external device has an output port, the output port of the external device being coupled to the user port. The external device is not shown in FIG. 14. The external device applies the excitation to the user port. The external device also delivers one or more "instructions of the external device" to the signal processing unit (2). The electrical links needed to deliver said instructions of the external device are not shown in FIG. 14.

The tuning control unit (3) receives said one or more temperature signals provided by the single-input-port and single-output-port tunable matching circuit, as shown in FIG. 14.

The tuning instructions may be of any type of digital message. In this eleventh embodiment, the tuning instructions are delivered during one or more tuning sequences. As shown in FIG. 11, each of the one or more tuning sequences comprises:
- a process "generating initial values of the tuning control signals" (23), in which the signal processing unit delivers one said initial tuning instruction, and in which the tuning control unit generates, for each of the one or more tuning control signals, an initial value determined as a function of said one or more temperature signals and as a function of said one said initial tuning instruction;
- a process "generating subsequent values of the tuning control signals" (24), in which the signal processing unit delivers two or more said subsequent tuning instructions, and in which the tuning control unit generates, for each of the one or more tuning control signals, two or more subsequent values each determined as a function of said one or more temperature signals and as a function of one of said two or more said subsequent tuning instructions.

During the process "generating initial values of the tuning control signals", the signal processing unit determines a frequency of operation, estimates the two or more real quantities depending on an impedance seen by the target port, and uses a lookup table to determine said one said initial tuning instruction, based on the frequency of operation and on the two or more real quantities depending on an impedance seen by the target port. The specialist understands how to build and use such a lookup table.

According to a first example of the process "generating initial values of the tuning control signals" (23), said lookup table may be stored in a read-only memory, and it may have been built using data obtained by determining, in a laboratory before manufacturing of the automatic tuning system, for different values of the impedance seen by the target port of a prototype and at different frequencies, initial tuning instructions producing the highest possible values of a transducer power gain of the single-input-port and single-output-port tunable matching circuit of the prototype. This process requires neither difficult computations nor a long time, because it directly uses the value of the frequency of operation and the two or more real quantities depending on an impedance seen by the target port, to determine said one said initial tuning instruction. This process quickly provides said one said initial tuning instruction, which is such that the transducer power gain is typically closer to a maximum transducer power gain achievable with the single-input-port and single-output-port tunable matching circuit, at the frequency of operation, than the transducer power gain obtained in the corresponding process of the first embodiment, because the tuning control unit takes into account the influences of the temperatures at said one or more locations.

According to a second example of the process "generating initial values of the tuning control signals" (23), said lookup table may be stored in a read-only memory, and it may have been built using data obtained by determining, in a laboratory before manufacturing of the automatic tuning system, for different values of the impedance seen by the target port of a prototype and at different frequencies, initial tuning instructions such that an absolute value of the difference between the impedance presented by the user port of the prototype and a wanted impedance is as small as possible. This process requires neither difficult computations nor a long time, because it directly uses the value of the frequency of operation and the two or more real quantities depending on an impedance seen by the target port, to determine said one said initial tuning instruction. This process quickly provides said one said initial tuning instruction, which is such that the impedance presented by the user port is typically closer to the wanted impedance, at the frequency of operation, than the impedance presented by the user port obtained in the corresponding process of the first embodiment, because the tuning control unit takes into account the influences of the temperatures at said one or more locations.

As in the first embodiment, the process "generating subsequent values of the tuning control signals" (24) uses a closed-loop control scheme and an extremum-seeking control algorithm, and it can substantially maximize an average power delivered by the target port, at the frequency of operation. This process is however typically faster, for a given accuracy, than the corresponding process of the first embodiment, because the process "generating initial values of the tuning control signals" (23) is typically more accurate, since the tuning control unit takes into account the influences of the temperatures at said one or more locations.

We observe that the eighth embodiment and this eleventh embodiment disclose a method comprising the steps of:

measuring, at one or more locations in the single-input-port and single-output-port tunable matching circuit, a temperature, to obtain one or more "temperature signals", each of the one or more temperature signals being mainly determined by one or more of the temperatures at said one or more locations;

generating, for each of the one or more tuning control signals, an initial value of said each of the one or more tuning control signals, the initial value being generated as a function of said one or more temperature signals and as a function of one or more real quantities depending on an impedance seen by the target port, said one or more real quantities depending on an impedance seen by the target port being estimated as a function of one or more of the one or more sensing unit output signals.

In this eleventh embodiment, it is also possible that each of the one or more initial tuning instructions is delivered as a function of said one or more temperature signals and as a function of said two or more real quantities depending on an impedance seen by the target port.

Twelfth Embodiment

Figure 15:
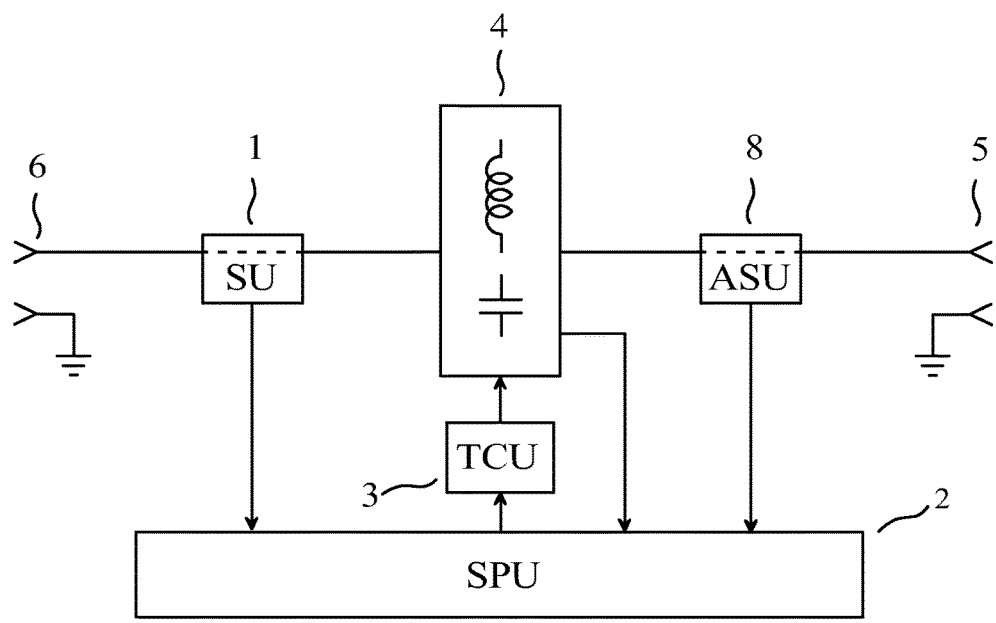
FIG. 15 shows the block diagram of an automatic tuning system of the invention (twelfth embodiment)

As a twelfth embodiment of a device of the invention, given by way of non-limiting example, we have represented in FIG. 15 the block diagram of an automatic tuning system having one user port (5) and one target port (6), the automatic tuning system allowing, at a given frequency greater than or equal to 300 MHz, a transfer of power from the user port to the target port, the automatic tuning system comprising:

a sensing unit (1), the sensing unit delivering two or more "sensing unit output signals", each of the sensing unit output signals being mainly determined by one or more electrical variables sensed at the target port while an excitation is applied to the user port;

an additional sensing unit (8), the additional sensing unit delivering one or more "additional sensing unit output signals", each of the one or more additional sensing unit output signals being mainly determined by one or more electrical variables sensed at the user port while said excitation is applied to the user port;

a single-input-port and single-output-port tunable matching circuit (4), the single-input-port and single-output-port tunable matching circuit comprising one or more adjustable impedance devices, the one or more adjustable impedance devices being referred to as "the adjustable impedance devices of the tunable matching circuit" and being such that, at said given frequency, each of the adjustable impedance devices of the tunable matching circuit has a reactance, the reactance of any one of the adjustable impedance devices of the tunable matching circuit having an influence on an impedance presented by the user port, the reactance of any one of the adjustable impedance devices of the tunable matching circuit being adjustable by electrical means, the single-input-port and single-output-port tunable matching circuit comprising a temperature measurement device which measures, at one or more locations in the single-input-port and single-output-port tunable matching circuit, a temperature, to obtain one or more "temperature signals", each of the one or more temperature signals being mainly determined by one or more of the temperatures at said one or more locations;

a signal processing unit (2), the signal processing unit delivering "tuning instructions", at least one of the tuning instructions being an "initial tuning instruction", each of the one or more initial tuning instructions being determined as a function of said one or more temperature signals and as a function of two or more real quantities depending on an impedance seen by the target port, said two or more real quantities depending on an impedance seen by the target port being estimated by utilizing two or more of the sensing unit output signals, at least one of the tuning instructions being a "subsequent tuning instruction", each of the one or more subsequent tuning instructions being determined by utilizing an extremum-seeking control algorithm, the extremum-seeking control algorithm seeking to minimize a performance variable, the performance variable being estimated by utilizing one or more of the sensing unit output signals; and a tuning control unit (3) similar to the one described in the eighth embodiment.

An external device has an output port, the output port of the external device being coupled to the user port. The external device is not shown in FIG. 15. The external device applies the excitation to the user port. The external device also delivers one or more "instructions of the external device" to the signal processing unit (2), said instructions of the external device informing the signal processing unit that said excitation has been applied, or is being applied. Additionally, the external device provides one or more other signals to the signal processing unit, and/or receives one or more other signals from the signal processing unit. The electrical links needed to deliver said instructions of the external device and to carry such other signals are not shown in FIG. 15.

The additional sensing unit (8) may for instance be such that the one or more additional sensing unit output signals comprise: a first additional sensing unit output signal proportional to a first electrical variable, the first electrical variable being a voltage across the user port; and a second additional sensing unit output signal proportional to a second electrical variable, the second electrical variable being a current flowing in the user port. Said voltage across the user port may be a complex voltage and said current flowing in the user port may be a complex current. Alternatively, the additional sensing unit (8) may for instance be such that the one or more additional sensing unit output signals comprise: a first additional sensing unit output signal proportional to a first electrical variable, the first electrical variable being an incident voltage at the user port; and a second additional sensing unit output signal proportional to a second electrical variable, the second electrical variable being a reflected voltage at the user port. Said incident voltage at the user port may be a complex incident voltage and said reflected voltage at the user port may be a complex reflected voltage. The specialist understands that said incident voltage at the user port is given by $u_F=(v_U+Z_{RU}i_U)/2$, and that said reflected voltage at the user port is given by $u_R=(v_U-Z_{RU}i_U)/2$, where $v_U$ is a complex voltage across the user port, $i_U$ is a complex current flowing in the user port, and $Z_{RU}$ is a reference impedance used to define the incident voltage at the user port.

The performance variable may be estimated by utilizing one or more of the one or more sensing unit output signals, and one or more of the one or more additional sensing unit output signals. For instance, the performance variable may be substantially a product of three terms, this product being the product of a negative constant, an average of the square of an instantaneous voltage at the target port, and the inverse of an average of the square of an instantaneous incident voltage at the user port. It is possible to show that, if the reference impedance used to define the incident voltage at the user port is equal to the internal impedance of said output port of the external device, then minimizing this performance variable maximizes a transducer power gain of the single-input-port and single-output-port tunable matching circuit. The specialist understands that an amplitude modulation of the excitation alone does not cause variations, as a function of time, of this performance variable, so that this performance variable is suitable in the case where the excitation is amplitude modulated.

A value of a carrier frequency of the excitation is determined by the signal processing unit, using the one or more additional sensing unit output signals.

The tuning instructions are delivered during one or more tuning sequences. A tuning sequence comprises a process "generating initial values of the tuning control signals", in which the signal processing unit delivers one said initial tuning instruction, and in which the tuning control unit generates, for each of the one or more tuning control signals, an initial value determined as a function of said one said initial tuning instruction. In this process, the signal processing unit receives said one or more temperature signals provided by the single-input-port and single-output-port tunable matching circuit, as shown in FIG. 15. The signal processing unit also knows a model of the single-input-port and single-output-port tunable matching circuit, this model taking into account the influences of the carrier frequency, of the two or more real quantities depending on an impedance seen by the target port, of a tuning instruction and of the temperatures at said one or more locations, on the impedance presented by the user port Z. This model is used to deliver said one said initial tuning instruction. This model includes: for each of the adjustable impedance devices of the tunable matching circuit, a lookup table about the characteristics of said each of the adjustable impedance devices of the tunable matching circuit; and one or more formulas for computing $Z_U$.

During the process "generating initial values of the tuning control signals", the signal processing unit estimates the two or more real quantities depending on an impedance seen by the target port, and uses an "open-loop algorithm" to determine said one said initial tuning instruction, said one said initial tuning instruction being such that a "predicted impedance", determined based on the model, is as close as possible to a wanted impedance, at the carrier frequency. This process requires neither difficult computations nor a long time, because the open-loop algorithm directly uses the carrier frequency, the two or more real quantities depending on an impedance seen by the target port, and the temperatures at said one or more locations, to determine said one said initial tuning instruction.

Thirteenth Embodiment

Figure 16:
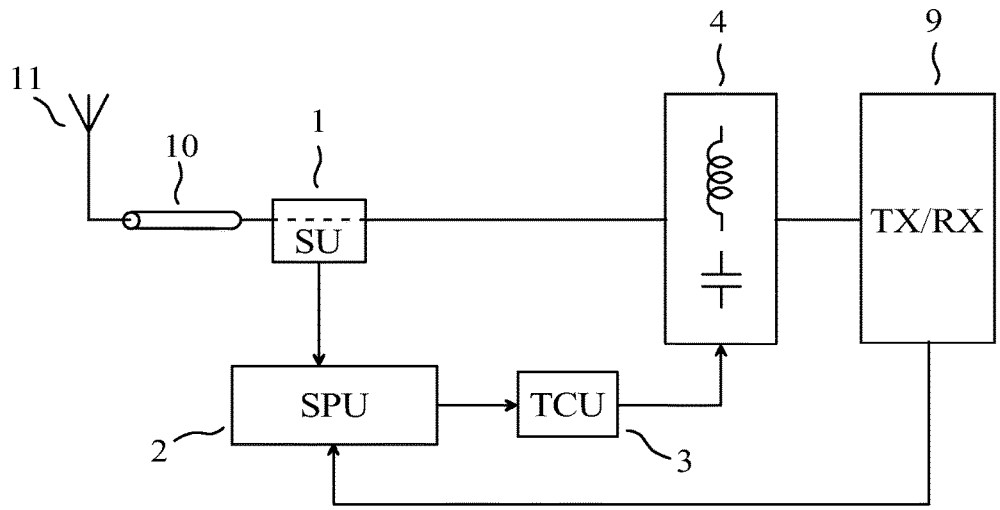
FIG. 16 shows the block diagram of a transceiver for radio communication comprising an automatic tuning system (thirteenth embodiment)

As a thirteenth embodiment of a device of the invention, given by way of non-limiting example, we have represented in FIG. 16 the block diagram of a transceiver for radio communication using an automatic tuning system of the invention. The transceiver shown in FIG. 16 is a transceiver for radio communication in a given frequency band, comprising:

an antenna (11), the antenna operating in the given frequency band;

a feeder (10), the feeder having a far end and a near end, the antenna being coupled to the far end of the feeder, the near end of the feeder presenting an impedance referred to as "the impedance presented by the near end of the feeder";

a radio device (9) which consists of all parts of the transceiver which are not shown elsewhere in FIG. 16, the radio device having a radio port, the radio device delivering "tuning sequence instructions" which indicate when a tuning sequence is being performed, an excitation being delivered by the radio port during said tuning sequence;

a sensing unit (1), the sensing unit delivering two "sensing unit output signals", each of the sensing unit output signals being mainly determined by an electrical variable sensed at the near end of the feeder during a tuning sequence;

a single-input-port and single-output-port tunable matching circuit (4), the single-input-port and single-output-port tunable matching circuit comprising an output port which is indirectly coupled to the near end of the feeder (10) through the sensing unit (1), the single-input-port and single-output-port tunable matching circuit comprising an input port which is directly coupled to the radio port of the radio device (9), the single-input-port and single-output-port tunable matching circuit comprising one or more adjustable impedance devices, the one or more adjustable impedance devices being referred to as "the adjustable impedance devices of the tunable matching circuit" and being such that, at a frequency in the given frequency band, each of the adjustable impedance devices of the tunable matching circuit has a reactance, the reactance of any one of the adjustable impedance devices of the tunable matching circuit being adjustable by electrical means;

a signal processing unit (2), the signal processing unit delivering "tuning instructions", at least one of the tuning instructions being an "initial tuning instruction", each of the one or more initial tuning instructions being determined as a function of a frequency of the excitation and as a function of two or more real quantities depending on the impedance presented by the near end of the feeder, said two or more real quantities depending on the impedance presented by the near end of the feeder being estimated by utilizing the tuning sequence instructions and the sensing unit output signals, at least one of the tuning instructions being a "subsequent tuning instruction", each of the one or more subsequent tuning instructions being determined by utilizing an extremum-seeking control algorithm, the extremum-seeking control algorithm seeking to maximize or to minimize a performance variable, the performance variable being estimated as a function of one or more of the sensing unit output signals; and a tuning control unit (3), the tuning control unit receiving the tuning instructions from the signal processing unit, the tuning control unit delivering one or more "tuning control signals" to the single-input-port and single-output-port tunable matching circuit, the tuning control unit generating, for each of the one or more tuning control signals, one or more values of said each of the one or more tuning control signals, each of said one or more values of said each of the one or more tuning control signals being determined as a function of at least one of the tuning instructions, the reactance of each of the adjustable impedance devices of the tunable matching circuit being determined by at least one of the one or more tuning control signals.

The specialist understands that said "impedance presented by the near end of the feeder" of this thirteenth embodiment corresponds to the "impedance seen by the target port" of the first embodiment.

The specialist understands that any small variation in the impedance of the antenna, caused by a change in operating frequency or a change in the medium surrounding the antenna, for instance due to the user interaction, can be compensated with an automatic adjustment of the adjustable impedance devices of the tunable matching circuit. Thus, it is always possible to obtain the best performance using the transceiver.

The transceiver is used for wireless transmission in a cellular network. The excitation is a bandpass signal, as in the eighth embodiment. The excitation is compatible with the requirements of standards typically applicable to cellular networks.

Fourteenth Embodiment

Figure 17:
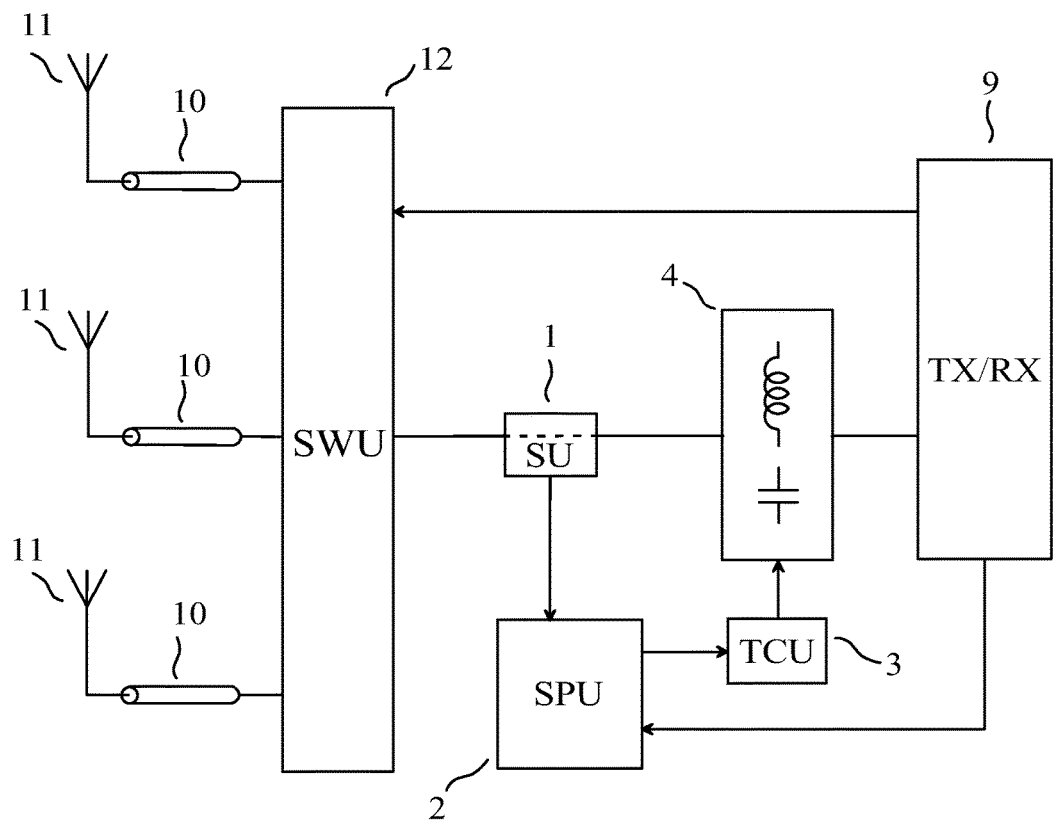
FIG. 17 shows the block diagram of a transceiver for radio communication comprising an automatic tuning system (fourteenth embodiment)

As a fourteenth embodiment of a device of the invention, given by way of non-limiting example, we have represented in FIG. 17 the block diagram of a transceiver for radio communication using an automatic tuning system of the invention. The transceiver shown in FIG. 17 is a transceiver for radio communication in a given frequency band, comprising:

N=3 antennas (11), the N antennas being such that they can operate at any frequency in the given frequency band;

a radio device (9) which consists of all parts of the transceiver which are not shown elsewhere in FIG. 17, the radio device having a radio port, the radio device delivering "tuning sequence instructions" which indicate when a tuning sequence is being performed, an excitation being delivered by the radio port during said tuning sequence;

a switching unit (12), the switching unit receiving a "configuration instruction" generated automatically by the radio device, the switching unit comprising N "antenna ports" each coupled to one and only one of the antennas through a feeder (10), the switching unit comprising an "array port", the switching unit operating in an active configuration determined by the configuration instruction, the active configuration being one of a plurality of allowed configurations, the switching unit providing, in any one of the allowed configurations, for signals in the given frequency band, a bidirectional path between the array port and one and only one of the antenna ports, the array port presenting an impedance referred to as "the impedance presented by the array port";

a sensing unit (1), the sensing unit delivering two "sensing unit output signals", each of the sensing unit output signals being mainly determined by an electrical variable sensed at the array port during a tuning sequence;

a single-input-port and single-output-port tunable matching circuit (4), the single-input-port and single-output-port tunable matching circuit comprising an output port which is indirectly coupled to the array port through the sensing unit (1), the single-input-port and single-output-port tunable matching circuit comprising an input port which is directly coupled to the radio port of the radio device (9), the single-input-port and single-output-port tunable matching circuit comprising one or more adjustable impedance devices, the one or more adjustable impedance devices being referred to as "the adjustable impedance devices of the tunable matching circuit" and being such that, at a frequency in the given frequency band, each of the adjustable impedance devices of the tunable matching circuit has a reactance, the reactance of any one of the adjustable impedance devices of the tunable matching circuit being adjustable by electrical means;

a signal processing unit (2), the signal processing unit delivering "tuning instructions", at least one of the tuning instructions being an "initial tuning instruction", each of the one or more initial tuning instructions being determined as a function of a carrier frequency of the excitation and as a function of two or more real quantities depending on the impedance presented by the array port, said two or more real quantities depending on the impedance presented by the array port being estimated by utilizing the tuning sequence instructions and the sensing unit output signals, at least one of the tuning instructions being a "subsequent tuning instruction", each of the one or more subsequent tuning instructions being determined by utilizing an extremum-seeking control algorithm, the extremum-seeking control algorithm seeking to maximize or to minimize a performance variable, the performance variable being estimated as a function of one or more of the sensing unit output signals; and a tuning control unit (3), the tuning control unit receiving the tuning instructions from the signal processing unit, the tuning control unit delivering one or more "tuning control signals" to the single-input-port and single-output-port tunable matching circuit, the tuning control unit generating, for each of the one or more tuning control signals, one or more values of said each of the one or more tuning control signals, said one or more values of said each of the one or more tuning control signals being determined as a function of at least one of the tuning instructions, the reactance of each of the adjustable impedance devices of the tunable matching circuit being determined by at least one of the one or more tuning control signals.

The specialist understands that said "impedance presented by the array port" of this fourteenth embodiment corresponds to the "impedance seen by the target port" of the first embodiment.

The switching unit operates (or is used) in an active configuration determined by the configuration instruction, the active configuration being an allowed configuration among a plurality of allowed configurations, the switching unit providing, in any one of the allowed configurations, for signals in the given frequency band, a path between the array port and one of the antenna ports. Thus, the switching unit operates in an active configuration which is one of the allowed configurations, and each allowed configuration corresponds to a selection of one antenna port among the N antenna ports.

The switching unit provides, for signals in the given frequency band, a path between the array port and the selected antenna port. This path may preferably be a low loss path for signals in the given frequency band. The specialist understands that a suitable switching unit may comprise one or more electrically controlled switches and/or change-over switches (here, "electrically controlled" means "controlled by electrical means"). In this case, one or more of said electrically controlled switches and/or change-over switches may for instance be an electro-mechanical relay, or a micro-electromechanical switch (MEMS switch), or a circuit using one or more PIN diodes and/or one or more insulated-gate field-effect transistors (MOSFETs) as switching devices.

For instance, the configuration instruction may be determined as a function of one or more of the following variables:

said two or more real quantities depending on the impedance presented by the array port;

one or more localization variables, each of the localization variables depending, in a given use configuration, on the distance between a part of a human body and a zone of the transceiver;

the frequencies used for radio communication with the selected antenna;

one or more additional variables, each of the additional variables lying in a set of additional variables, the elements of the set of additional variables comprising: communication type variables which indicate whether a radio communication session is a voice communication session, a data communication session or another type of communication session; a speakerphone mode activation indicator; a speaker activation indicator; variables obtained using one or more accelerometers; user identity variables which depend on the identity of the current user; reception quality variables; and emission quality variables.

For instance, at least one of the localization variables may be an output of a localization sensor responsive to a pressure exerted by a part of a human body. For instance, at least one of the localization variables may be an output of a proximity sensor. For instance, at least one of the localization variables may be determined by a change of state of an output of a touchscreen.

The elements of said set of additional variables may further comprise one or more variables which are different from the localization variables and which characterize the grip with which a user is holding the transceiver.

The configuration instruction may for instance be determined using a lookup table.

In FIG. 17, we have N=3. More generally, N can be any integer greater than or equal to two.

Fifteenth Embodiment

Figure 18:
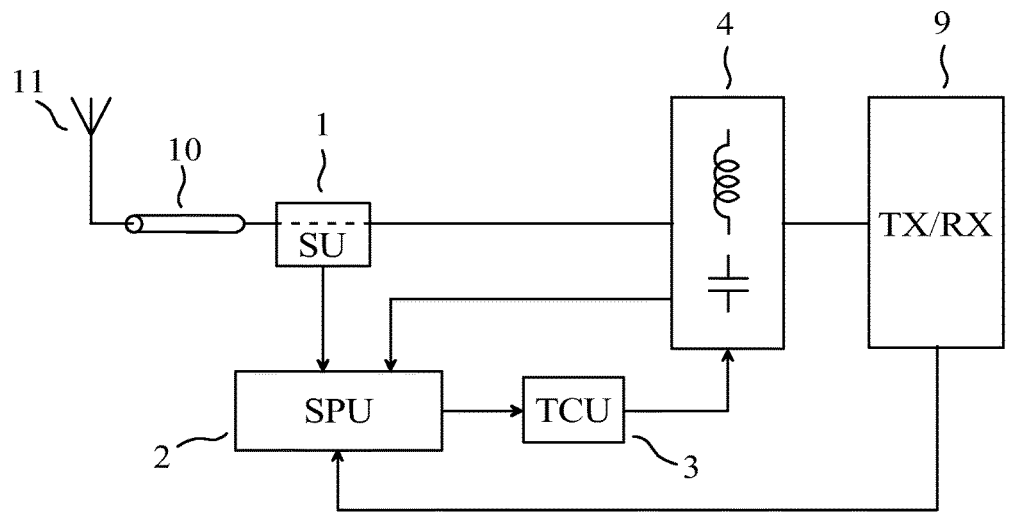
FIG. 18 shows the block diagram of a transceiver for radio communication comprising an automatic tuning system (fifteenth embodiment)

As a fifteenth embodiment of a device of the invention, given by way of non-limiting example, we have represented in FIG. 18 the block diagram of a transceiver for radio communication using an automatic tuning system of the invention. The transceiver shown in FIG. 18 is a transceiver for radio communication in a given frequency band, comprising:

an antenna (11), the antenna operating in the given frequency band;

a feeder (10), the feeder having a far end and a near end, the antenna being coupled to the far end of the feeder, the near end of the feeder presenting an impedance referred to as "the impedance presented by the near end of the feeder";

a radio device (9) which consists of all parts of the transceiver which are not shown elsewhere in FIG. 18, the radio device having a radio port, the radio device delivering "tuning sequence instructions" which indicate when a tuning sequence is being performed, an excitation being delivered by the radio port during said tuning sequence;

a sensing unit (1), the sensing unit delivering two "sensing unit output signals", each of the sensing unit output signals being mainly determined by an electrical variable sensed at the near end of the feeder during a tuning sequence;

a single-input-port and single-output-port tunable matching circuit (4), the single-input-port and single-output-port tunable matching circuit comprising an output port which is indirectly coupled to the near end of the feeder (10) through the sensing unit (1), the single-input-port and single-output-port tunable matching circuit comprising an input port which is directly coupled to the radio port of the radio device (9), the single-input-port and single-output-port tunable matching circuit comprising one or more adjustable impedance devices, the one or more adjustable impedance devices being referred to as "the adjustable impedance devices of the tunable matching circuit" and being such that, at a frequency in the given frequency band, each of the adjustable impedance devices of the tunable matching circuit has a reactance, the reactance of any one of the adjustable impedance devices of the tunable matching circuit being adjustable by electrical means, the single-input-port and single-output-port tunable matching circuit comprising a temperature measurement device which measures, at one or more locations in the single-input-port and single-output-port tunable matching circuit, a temperature, to obtain one or more "temperature signals", each of the one or more temperature signals being mainly determined by one or more of the temperatures at said one or more locations;

a signal processing unit (2), the signal processing unit delivering "tuning instructions", at least one of the tuning instructions being an "initial tuning instruction", each of the one or more initial tuning instructions being determined as a function of a frequency of the excitation, as a function of said one or more temperature signals and as a function of two or more real quantities depending on the impedance presented by the near end of the feeder, said two or more real quantities depending on the impedance presented by the near end of the feeder being estimated by utilizing the tuning sequence instructions and the sensing unit output signals, at least one of the tuning instructions being a "subsequent tuning instruction", each of the one or more subsequent tuning instructions being determined by utilizing an extremum-seeking control algorithm, the extremum-seeking control algorithm seeking to maximize or to minimize a performance variable, the performance variable being estimated as a function of one or more of the sensing unit output signals; and a tuning control unit (3), the tuning control unit receiving the tuning instructions from the signal processing unit, the tuning control unit delivering one or more "tuning control signals" to the single-input-port and single-output-port tunable matching circuit, the tuning control unit generating, for each of the one or more tuning control signals, one or more values of said each of the one or more tuning control signals, each of said one or more values of said each of the one or more tuning control signals being determined as a function of at least one of the tuning instructions, the reactance of each of the adjustable impedance devices of the tunable matching circuit being mainly determined by at least one of the one or more tuning control signals.

The specialist understands that said "impedance presented by the near end of the feeder" of this fifteenth embodiment corresponds to said "impedance seen by the target port" of the eighth embodiment.

The specialist understands that any small variation in the impedance of the antenna, caused by a change in operating frequency or a change in the medium surrounding the antenna, for instance due to the user interaction, can be compensated with an automatic adjustment of the adjustable impedance devices of the tunable matching circuit. Thus, it is always possible to obtain the best performance using the transceiver.

The transceiver is used for wireless transmission in a cellular network. The excitation is a bandpass signal, as in the eighth embodiment. The excitation is compatible with the requirements of standards typically applicable to cellular networks.

Sixteenth Embodiment

Figure 19:
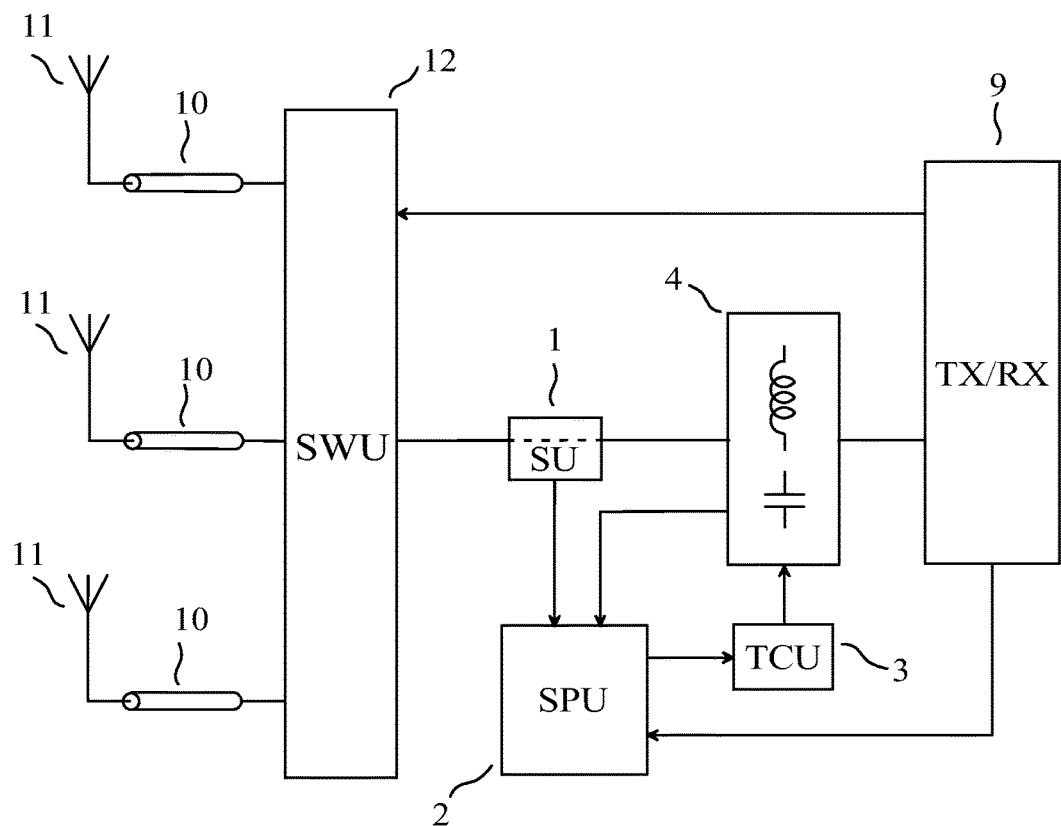
FIG. 19 shows the block diagram of a transceiver for radio communication comprising an automatic tuning system (sixteenth embodiment).

As a sixteenth embodiment of a device of the invention, given by way of non-limiting example, we have represented in FIG. 19 the block diagram of a transceiver for radio communication using an automatic tuning system of the invention. The transceiver shown in FIG. 19 is a transceiver for radio communication in a given frequency band, comprising:

N=3 antennas (11), the N antennas being such that they can operate at any frequency in the given frequency band;

a radio device (9) which consists of all parts of the transceiver which are not shown elsewhere in FIG. 19, the radio device having a radio port, the radio device delivering "tuning sequence instructions" which indicate when a tuning sequence is being performed, an excitation being delivered by the radio port during said tuning sequence;

a switching unit (12), the switching unit receiving a "configuration instruction" generated automatically by the radio device, the switching unit comprising N "antenna ports" each coupled to one and only one of the antennas through a feeder (10), the switching unit comprising an "array port", the switching unit operating in an active configuration determined by the configuration instruction, the active configuration being one of a plurality of allowed configurations, the switching unit providing, in any one of the allowed configurations, for signals in the given frequency band, a path between the array port and one and only one of the antenna ports, the array port presenting an impedance referred to as "the impedance presented by the array port";

a sensing unit (1), the sensing unit delivering two "sensing unit output signals", each of the sensing unit output signals being mainly determined by an electrical variable sensed at the array port during a tuning sequence;

a single-input-port and single-output-port tunable matching circuit (4), the single-input-port and single-output-port tunable matching circuit comprising an output port which is indirectly coupled to the array port through the sensing unit (1), the single-input-port and single-output-port tunable matching circuit comprising an input port which is directly coupled to the radio port of the radio device (9), the single-input-port and single-output-port tunable matching circuit comprising one or more adjustable impedance devices, the one or more adjustable impedance devices being referred to as "the adjustable impedance devices of the tunable matching circuit" and being such that, at a frequency in the given frequency band, each of the adjustable impedance devices of the tunable matching circuit has a reactance, the reactance of any one of the adjustable impedance devices of the tunable matching circuit being adjustable by electrical means, the single-input-port and single-output-port tunable matching circuit comprising a temperature measurement device which measures, at one or more locations in the single-input-port and single-output-port tunable matching circuit, a temperature, to obtain one or more "temperature signals", each of the one or more temperature signals being mainly determined by one or more of the temperatures at said one or more locations;

a signal processing unit (2), the signal processing unit delivering "tuning instructions", at least one of the tuning instructions being an "initial tuning instruction", each of the one or more initial tuning instructions being determined as a function of a carrier frequency of the excitation, as a function of said one or more temperature signals and as a function of two or more real quantities depending on the impedance presented by the array port, said two or more real quantities depending on the impedance presented by the array port being estimated by utilizing the tuning sequence instructions and the sensing unit output signals, at least one of the tuning instructions being a "subsequent tuning instruction", each of the one or more subsequent tuning instructions being determined by utilizing an extremum-seeking control algorithm, the extremum-seeking control algorithm seeking to maximize or to minimize a performance variable, the performance variable being estimated as a function of one or more of the sensing unit output signals; and a tuning control unit (3), the tuning control unit receiving the tuning instructions from the signal processing unit, the tuning control unit delivering one or more "tuning control signals" to the single-input-port and single-output-port tunable matching circuit, the tuning control unit generating, for each of the one or more tuning control signals, one or more values of said each of the one or more tuning control signals, said one or more values of said each of the one or more tuning control signals being determined as a function of at least one of the tuning instructions, the reactance of each of the adjustable impedance devices of the tunable matching circuit being mainly determined by at least one of the one or more tuning control signals.

The specialist understands that said "impedance presented by the array port" of this sixteenth embodiment corresponds to said "impedance seen by the target port" of the eighth embodiment.

The configuration instruction may for instance be determined as in the fourteenth embodiment.

In FIG. 19, we have N=3. More generally, N can be any integer greater than or equal to two.

INDICATIONS ON INDUSTRIAL APPLICATIONS

The method of the invention is suitable for optimally and automatically adjusting a single-input-port and single-output-port tunable matching circuit, and the automatic tuning system of the invention can automatically and optimally adjust its single-input-port and single-output-port tunable matching circuit. The automatic tuning system of the invention may be a part of a radio receiver, or of a radio transmitter. In such applications, the target port of the automatic tuning system of the invention may be directly or indirectly coupled to an antenna, and the user port of the automatic tuning system of the invention may be coupled to a radio-frequency signal input port of the radio receiver, or to a radio-frequency signal output port of the radio transmitter.

The method and the automatic tuning system of the invention can optimally, quickly and automatically adjust the single-input-port and single-output-port tunable matching circuit, without very difficult computations. The invention is therefore particularly suitable for mobile radio transmitters and radio transceivers, for instance those used in portable radiotelephones or portable computers, which may be subject to fast variations in the electromagnetic characteristics of the medium surrounding the one or more antennas being used for radio communication.

The invention claimed is:

1. A method for automatic adjustment of a single-input-port and single-output-port tunable matching circuit, the single-input-port and single-output-port tunable matching circuit being a part of an automatic tuning system having a user port and a target port, the automatic tuning system allowing, at a given frequency, a transfer of power from the user port to the target port, the single-input-port and single-output-port tunable matching circuit comprising one or more adjustable impedance devices, the one or more adjustable impedance devices being referred to as the adjustable impedance devices of the tunable matching circuit and being such that, at said given frequency, each of the adjustable impedance devices of the tunable matching circuit has a reactance, the reactance of any one of the adjustable impedance devices of the tunable matching circuit being adjustable by electrical means, the reactance of each of the adjustable impedance devices of the tunable matching circuit being mainly determined by one or more tuning control signals, the method comprising the steps of:

applying an excitation to the user port;

sensing one or more electrical variables at the target port while the excitation is applied, to obtain one or more sensing unit output signals, each of the one or more sensing unit output signals being mainly determined by at least one of the one or more electrical variables sensed at the target port;

generating, for each of the one or more tuning control signals, an initial value of said each of the one or more tuning control signals, as a function of one or more real quantities depending on an impedance seen by the target port, said one or more real quantities depending on an impedance seen by the target port being estimated as a function of one or more of the one or more sensing unit output signals; and generating, for one or more of the one or more tuning control signals, at least one subsequent value of each of said one or more of the one or more tuning control signals, an extremum-seeking control algorithm being utilized to generate said at least one subsequent value of each of said one or more of the one or more tuning control signals, the extremum-seeking control algorithm seeking to maximize or to minimize a performance variable by controlling said one or more of the one or more tuning control signals, the performance variable being estimated as a function of one or more of the one or more sensing unit output signals.

2. The method of claim 1, wherein the single-input-port and single-output-port tunable matching circuit has an input port which is coupled to the user port, and wherein the single-input-port and single-output-port tunable matching circuit has an output port which is coupled to the target port.

3. The method of claim 2, wherein the reactance of any one of the adjustable impedance devices of the tunable matching circuit has an influence on an impedance presented by the user port.

4. The method of claim 2, wherein open-loop control is utilized to generate said initial value of said each of the one or more tuning control signals.

5. The method of claim 2, wherein:
the number of said one or more sensing unit output signals is greater than or equal to 2;
the number of said one or more real quantities depending on an impedance seen by the target port is greater than or equal to 2; and
said one or more real quantities depending on an impedance seen by the target port are sufficient for being able to compute a real part and an imaginary part of the impedance seen by the target port.

6. The method of claim 2, wherein the extremum-seeking control algorithm comprises a step in which one or more perturbations are each applied to one of the tuning control signals.

7. The method of claim 2, wherein the excitation is produced from a modulating signal, the performance variable being inversely proportional to an image of an absolute value of the modulating signal under a function.

8. The method of claim 7, wherein the performance variable is substantially proportional to the image, under the function, of an absolute value of a complex envelope of an electrical variable sensed at the target port.

9. An automatic tuning system having a user port and a target port, the automatic tuning system allowing, at a given frequency, a transfer of power from the user port to the target port, the automatic tuning system comprising:
a sensing unit, the sensing unit delivering one or more sensing unit output signals, each of the one or more sensing unit output signals being mainly determined by one or more electrical variables sensed at the target port while an excitation is applied to the user port;
a single-input-port and single-output-port tunable matching circuit, the single-input-port and single-output-port tunable matching circuit comprising one or more adjustable impedance devices, the one or more adjustable impedance devices being referred to as the adjustable impedance devices of the tunable matching circuit and being such that, at said given frequency, each of the adjustable impedance devices of the tunable matching circuit has a reactance, the reactance of any one of the adjustable impedance devices of the tunable matching circuit being adjustable by electrical means;
a signal processing unit, the signal processing unit delivering tuning instructions, at least one of the tuning instructions being an initial tuning instruction, each of the one or more initial tuning instructions being determined as a function of one or more real quantities depending on an impedance seen by the target port, said one or more real quantities depending on an impedance seen by the target port being estimated as a function of one or more of the one or more sensing unit output signals, at least one of the tuning instructions being a subsequent tuning instruction, the signal processing unit performing an extremum-seeking control algorithm to determine each of the one or more subsequent tuning instructions, the extremum-seeking control algorithm seeking to maximize or to minimize a performance variable, the performance variable being estimated as a function of one or more of the one or more sensing unit output signals; and
a tuning control unit, the tuning control unit receiving the tuning instructions from the signal processing unit, the tuning control unit delivering one or more tuning control signals to the single-input-port and single-output-port tunable matching circuit, the tuning control unit generating, for each of the one or more tuning control signals, one or more values of said each of the one or more tuning control signals, said one or more values of said each of the one or more tuning control signals being determined as a function of at least one of the tuning instructions, the reactance of each of the adjustable impedance devices of the tunable matching circuit being mainly determined by at least one of the one or more tuning control signals.

10. The automatic tuning system of claim 9, wherein the single-input-port and single-output-port tunable matching circuit has an input port which is coupled to the user port, and wherein the single-input-port and single-output-port tunable matching circuit has an output port which is coupled to the target port.

11. The automatic tuning system of claim 10, wherein the reactance of any one of the adjustable impedance devices of the tunable matching circuit has an influence on an impedance presented by the user port.

12. The automatic tuning system of claim 10, wherein open-loop control is utilized to determine each of the one or more initial tuning instructions.

13. The automatic tuning system of claim 10, wherein:
the number of said one or more sensing unit output signals is greater than or equal to 2;
the number of said one or more real quantities depending on an impedance seen by the target port is greater than or equal to 2; and
said one or more real quantities depending on an impedance seen by the target port are sufficient for being able to compute a real part and an imaginary part of the impedance seen by the target port.

14. The automatic tuning system of claim 10, wherein the sensing unit output signals comprise: a first sensing unit output signal proportional to a first electrical variable, the first electrical variable being a voltage across the target port; and a second sensing unit output signal proportional to a second electrical variable, the second electrical variable being a current flowing out of the target port.

15. The automatic tuning system of claim 10, wherein the sensing unit output signals comprise: a first sensing unit output signal proportional to a first electrical variable, the first electrical variable being an incident voltage at the target port; and a second sensing unit output signal proportional to a second electrical variable, the second electrical variable being a reflected voltage at the target port.

16. The automatic tuning system of claim 10, wherein the extremum-seeking control algorithm comprises a step in which one or more perturbations are each applied to one of the tuning control signals.

17. The automatic tuning system of claim 10, wherein the tuning instructions are delivered during one or more tuning sequences, each of the one or more tuning sequences comprising:
a process in which the signal processing unit delivers one said initial tuning instruction, and in which the tuning control unit generates, for each of the one or more tuning control signals, an initial value determined as a function of said one said initial tuning instruction; and
a process in which the signal processing unit delivers two or more said subsequent tuning instructions, and in which the tuning control unit generates, for each of the one or more tuning control signals, two or more subsequent values each determined as a function of one of said two or more said subsequent tuning instructions.

18. The automatic tuning system of claim 10, wherein the excitation is produced from a modulating signal, the performance variable being inversely proportional to an image of an absolute value of the modulating signal under a function.

19. The automatic tuning system of claim 18, wherein the performance variable is substantially proportional to the image, under the function, of an absolute value of a complex envelope of an electrical variable sensed at the target port.

20. The automatic tuning system of claim 10, wherein the performance variable is such that the extremum-seeking control algorithm substantially maximizes an average power delivered by the target port while the excitation is applied to the user port.

* * * * *